(12) United States Patent
Son et al.

(10) Patent No.: US 11,398,538 B2
(45) Date of Patent: Jul. 26, 2022

(54) LIGHT EMITTING DIODE DISPLAY DEVICE AND MULTI-SCREEN DISPLAY DEVICE USING THE SAME

(71) Applicant: LG Display Co., Ltd., Seoul (KR)

(72) Inventors: HyeonHo Son, Goyang-si (KR); WooNam Jeong, Paju-si (KR); SeungChul Lee, Goyang-si (KR); BuYeol Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 5 days.

(21) Appl. No.: 16/788,081

(22) Filed: Feb. 11, 2020

(65) Prior Publication Data
US 2020/0176537 A1    Jun. 4, 2020

Related U.S. Application Data

(63) Continuation of application No. 15/793,155, filed on Oct. 25, 2017, now Pat. No. 10,593,743.

(30) Foreign Application Priority Data

Dec. 30, 2016   (KR) .......................... 10-2016-0184458

(51) Int. Cl.
  *H01L 27/32*    (2006.01)
  *G09G 3/32*    (2016.01)
  (Continued)

(52) U.S. Cl.
  CPC ........ *H01L 27/3267* (2013.01); *G06F 1/1637* (2013.01); *G06F 1/1647* (2013.01);
  (Continued)

(58) Field of Classification Search
  CPC . H01L 27/3267; H01L 27/32; H01L 27/3216; H01L 27/3293; H01L 23/3121;
  (Continued)

(56) References Cited

U.S. PATENT DOCUMENTS 5,880,705 A    3/1999 Onyskevych et al.
6,025,901 A *  2/2000 Adachi ............... G02F 1/13452
                                                 349/158

(Continued)

FOREIGN PATENT DOCUMENTS

CN       104835829 A    8/2015
CN       105742451 A    7/2016
(Continued)

*Primary Examiner* — Nitin Patel
*Assistant Examiner* — Amen W Bogale
(74) *Attorney, Agent, or Firm* — Seed IP Law Group LLP

(57) ABSTRACT

Disclosed are a light emitting diode display device and a multi-screen display device using the same, which include a reduced or minimized bezel area. The light emitting diode display device includes a substrate including a first display area and a second display area outside of the first display area, a plurality of first unit pixels in the first display area, the plurality of first unit pixels each including a plurality of subpixels each including a micro light emitting device, and a plurality of second unit pixels in the second display area adjacent an edge of the substrate. A distance between the second unit pixel and an outer surface of the substrate is equal to or less than half of a reference pixel pitch at which the plurality of first unit pixels are arranged.

24 Claims, 11 Drawing Sheets

(51) Int. Cl.
*G06F 1/16* (2006.01)
*G06F 3/14* (2006.01)

(52) U.S. Cl.
CPC .......... *G06F 3/1423* (2013.01); *G06F 3/1446* (2013.01); *G09G 3/32* (2013.01); *H01L 27/32* (2013.01); *G09G 2300/026* (2013.01); *G09G 2300/0408* (2013.01); *G09G 2300/0426* (2013.01); *G09G 2320/0233* (2013.01)

(58) Field of Classification Search
CPC ............ H01L 23/3135; H01L 23/3157; H01L 23/315; H01L 23/28; H01L 25/0753; H01L 21/02065; H01L 21/02074; H01L 21/02664; H01L 21/31051; H01L 21/31058; H01L 21/32115; H01L 21/3105; H01L 21/321; H01L 21/76819; H01L 21/7684; H01L 21/31; H01L 21/56; H01L 21/469; H01L 21/67126; H01L 51/5237; H01L 51/5246; H01L 51/5253; H01L 51/102; H01L 51/107; H01L 51/448; H01L 2933/005; H01L 2933/0066; H01L 2933/0016; H01L 2933/0025; H01L 33/44; H01L 33/62; H01L 33/382; H01L 33/20; H01L 2924/181; H01L 2924/1811; H01L 2924/1815; G09G 2300/026; G09G 3/32; G09G 3/3208; G09G 3/2074; G09G 2300/0421; G09G 2300/04; G09G 2300/0408; G09G 2300/023; G09G 2300/0426; G09G 2300/0439; G09G 2300/0452; G09G 2300/0465; G09G 2320/0233; G09G 2340/0407; G09G 2360/04; G06F 3/1446; G06F 3/1423; G06F 1/1647; G06F 1/1637; G06F 1/1649; G06F 1/165; G06F 1/1652; G06F 1/1654; G02F 1/134309; G02F 1/1343; G02F 1/1368; G02F 1/136286; G02F 1/133388; G02F 1/133391; G02F 1/134345; G02F 1/13336; G09F 9/3026; G02B 27/1066

See application file for complete search history.

(56) References Cited

U.S. PATENT DOCUMENTS

| | | | |
|---|---|---|---|
| 6,498,592 B1 | 12/2002 | Matthies | |
| 9,472,734 B1* | 10/2016 | Chen | H01L 33/502 |
| 2004/0208210 A1 | 10/2004 | Inoguchi | |
| 2005/0020175 A1 | 1/2005 | Tamashiro et al. | |
| 2005/0140260 A1 | 6/2005 | Park et al. | |
| 2009/0219225 A1* | 9/2009 | Cope | H01L 25/0655 345/55 |
| 2012/0236509 A1 | 9/2012 | Cope et al. | |
| 2013/0016494 A1 | 1/2013 | Speier et al. | |
| 2014/0159067 A1 | 6/2014 | Sakariya et al. | |
| 2014/0218956 A1* | 8/2014 | Wu | G02F 1/13336 362/311.01 |
| 2015/0097837 A1* | 4/2015 | Jepsen | G06F 3/1446 345/428 |
| 2015/0261046 A1* | 9/2015 | Miki | G02F 1/133514 349/42 |
| 2016/0141278 A1* | 5/2016 | Lai | H01L 24/05 257/13 |
| 2016/0179453 A1 | 6/2016 | Jepsen et al. | |
| 2016/0190213 A1 | 6/2016 | Kim et al. | |
| 2016/0247440 A1* | 8/2016 | Shi | G09G 3/36 |
| 2016/0316578 A1 | 10/2016 | Cha | |
| 2016/0372514 A1 | 12/2016 | Chang et al. | |
| 2018/0166607 A1* | 6/2018 | Wu | H01L 33/06 |
| 2021/0280817 A1* | 9/2021 | Logunov | H01L 51/56 |

FOREIGN PATENT DOCUMENTS

| | | |
|---|---|---|
| GB | 2531558 A | 4/2016 |
| WO | 2011082497 A1 | 7/2011 |

* cited by examiner

LIGHT EMITTING DIODE DISPLAY DEVICE AND MULTI-SCREEN DISPLAY DEVICE USING THE SAME

CROSS-REFERENCE TO RELATED APPLICATIONS

This application is a continuation of U.S. patent application Ser. No. 15/793,155 filed on Oct. 25, 2017, which claims the benefit and priority filing date of the Korean Patent Application No. 10-2016-0184458 filed on Dec. 30, 2016, which is hereby incorporated by reference as if fully set forth herein.

BACKGROUND

Technical Field

The present disclosure relates to a light emitting diode display device and a multi-screen display device using the same.

Description of the Related Art

Display devices are being widely used as a display screen of notebook computers, tablet computers, smartphones, portable display devices, and portable information devices in addition to a display screen of television (TVs) and monitors.

LCD devices and organic light emitting display devices display an image by using thin film transistors (TFTs) as switching elements. Since the LCD devices cannot self-emit light, the LCD devices display an image by using light emitted from a backlight unit which is disposed under a liquid crystal display panel. Since the LCD devices include a backlight unit, a design of the LCD devices is limited, and luminance and a response time are reduced. Since the organic light emitting display devices include an organic material, the organic light emitting display devices are vulnerable to water, causing a reduction in reliability and lifetime.

Recently, research and development on light emitting diode display devices including a micro light emitting device are being done. The light emitting diode display devices have high image quality and high reliability, and thus, are attracting much attention as next-generation display devices.

A related art light emitting diode display device is manufactured by transferring a micro light emitting device onto a thin film transistor (TFT) array substrate, and due to a transfer process time taken in a transfer process for the micro light emitting device, current transfer technology is more advantageous to display devices having a relatively large size than panels having a relatively small size.

However, in the related art light emitting diode display device, a pad part for applying signals is provided in an edge of the TFT array substrate, and due to an instrument for covering the pad part, a bezel area increases.

Moreover, in a case where the related art light emitting diode display device is manufactured to have a large size, the number of pixels increases, and for this reason, a transfer error rate of a micro light emitting device increases, causing a reduction in productivity. In order to solve such a problem, research and development are being recently done on multi-screen devices which realize a large-size screen and are implemented by connecting two or more light emitting diode display devices having a relatively small size. However, in the multi-screen devices, due to a bezel area of each of the two or more light emitting diode display devices, a seam (or a boundary portion) exists between display devices coupled to each other. When displaying one image on a whole screen, the boundary portion causes a sense of discontinuity of the whole screen, causing a reduction in degree of viewing immersion of a user.

BRIEF SUMMARY

Accordingly, the present disclosure is directed to provide a light emitting diode display device and a multi-screen display device using the same that substantially obviate one or more problems due to limitations and disadvantages of the related art.

An aspect of the present disclosure is directed to provide a light emitting diode display device and a multi-screen display device using the same, which include a reduced or minimized bezel area.

Another aspect of the present disclosure is directed to provide a multi-screen display device in which a boundary portion between adjacent display devices is reduced or minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting diode display device including a substrate including a first display area and a second display area surrounding the first display area, a plurality of first unit pixels provided in the first display area and each including a plurality of subpixels each including a micro light emitting device, and a plurality of second unit pixels provided in the second display area overlapping an edge of the substrate and each including a plurality of subpixels and having a size less than a size of each of the plurality of first unit pixels.

The plurality of first unit pixels may be arranged at a reference pixel pitch, and a distance between a center portion of each of the plurality of second unit pixels and an outer surface of the substrate may be half or less of the reference pixel pitch.

In another aspect of the present disclosure, there is provided a multi-screen display device including a plurality of screen modules each including a light emitting diode display device and a plurality of module coupling members coupling side surfaces of the plurality of screen modules, wherein the light emitting diode display device including a substrate including a first display area and a second display area surrounding the first display area, a plurality of first unit pixels provided in the first display area and each including a plurality of subpixels each including a micro light emitting device, and a plurality of second unit pixels provided in the second display area overlapping an edge of the substrate and each including a plurality of subpixels and having a size less than a size of each of the plurality of first unit pixels.

A maximum distance between second unit pixels of two screen modules which are adjacent to each other with one of the plurality of module coupling members therebetween may be equal to or less than a reference pixel pitch of a first unit pixel, and the reference pixel pitch may be a distance between center portions of two adjacent first unit pixels.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
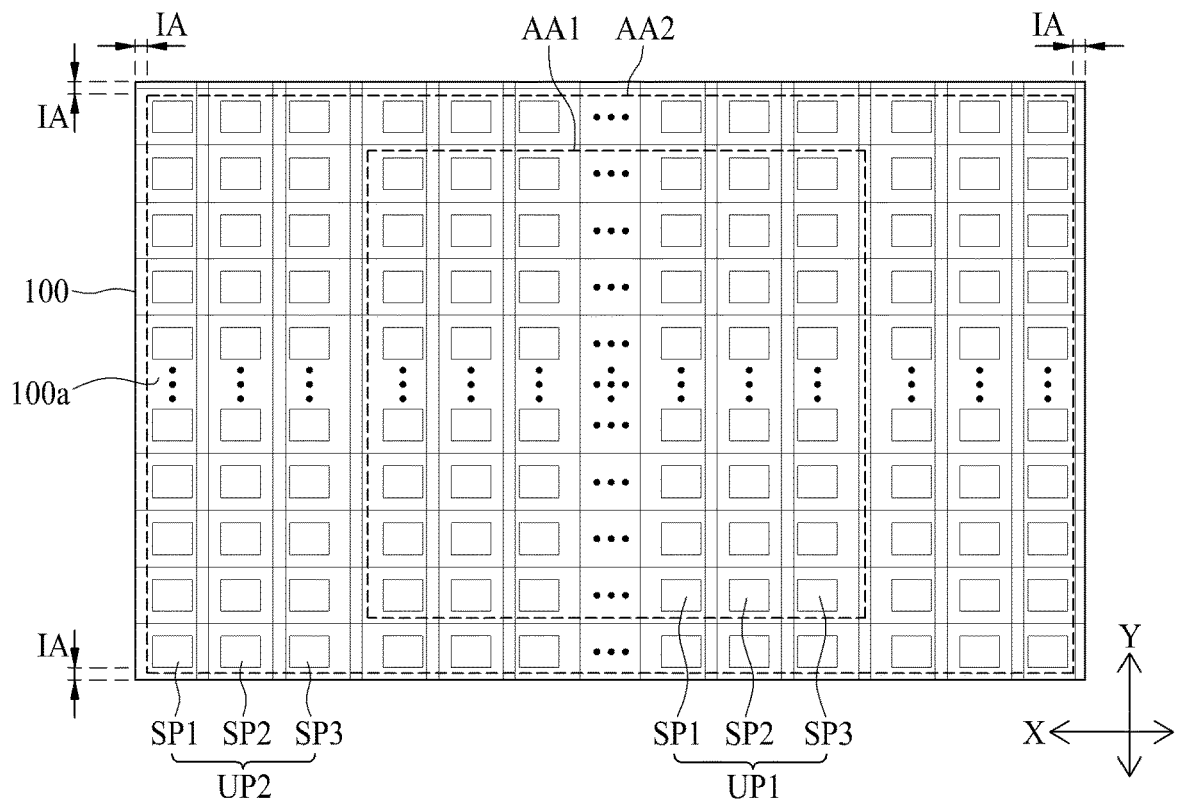
FIG. 1 is a plan view of a light emitting diode display device according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of a light emitting diode display device and a multi-screen display device using the same according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Figure 2:
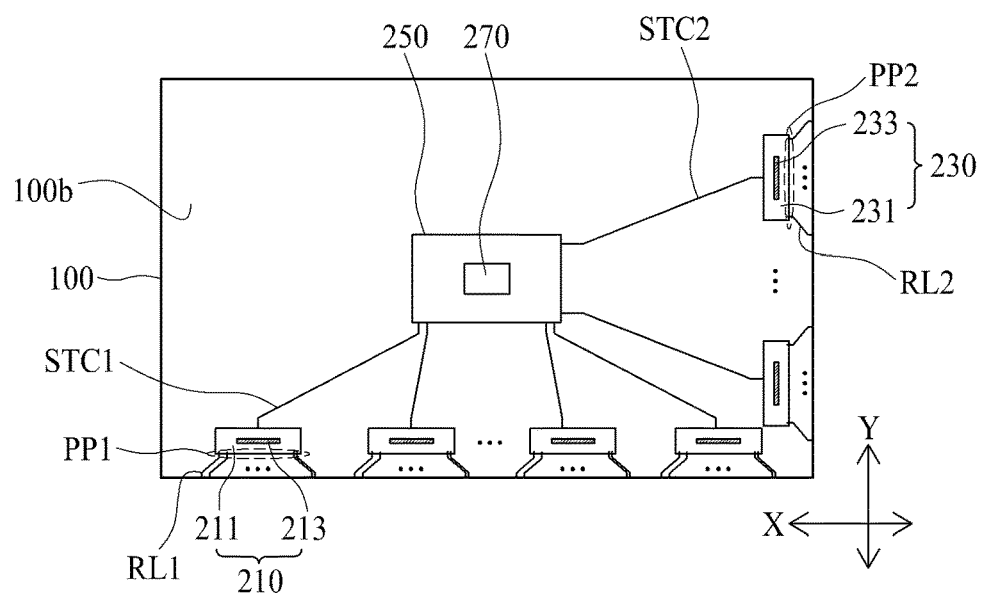
FIG. 2 is a plan view illustrating a rear surface of a substrate illustrated in FIG. 1.
Figure 3:
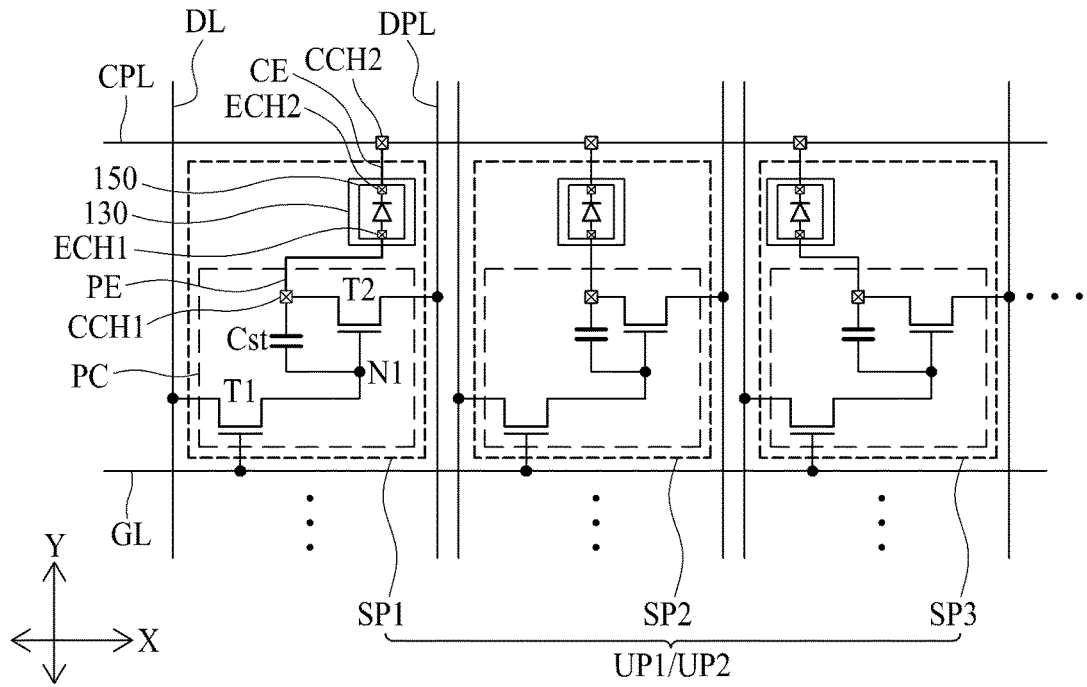
FIG. 3 is a diagram for describing a configuration of a unit pixel according to an embodiment illustrated in FIG. 1.

FIG. 1 is a plan view of a light emitting diode display device according to an embodiment of the present disclosure. FIG. 2 is a plan view illustrating a rear surface of a substrate illustrated in FIG. 1. FIG. 3 is a diagram for describing a configuration of a unit pixel according to an embodiment illustrated in FIG. 1.

Referring to FIGS. 1 to 3, the light emitting diode display device according to an embodiment of the present disclosure may include a substrate 100, a plurality of first unit pixels UP1, and a plurality of second unit pixels UP2.

The substrate 100 may be a thin film transistor (TFT) array substrate and may be formed of glass, a plastic material, and/or the like. The substrate 100 according to an embodiment may include a first display area AA1 and a second display area AA2.

The first display area AA1 may be defined as a center area other than an edge of the substrate 100.

The second display area AA2 may be defined to surround the first display area AA1 and may overlap the edge of the substrate 100.

In addition, the substrate 100 may further include a non-display area IA surrounding the second display area AA2. The non-display area IA may be provided between an outer surface (e.g., a side surface) of the substrate 100 and the second display area AA2, may have a relatively very narrow width, and may be defined as a bezel area.

The plurality of first unit pixels UP1 may be provided in the first display area AA1. In this case, the plurality of first unit pixels UP1 may be arranged at a predetermined first reference pixel pitch along a first horizontal axis direction X and at a predetermined second reference pixel pitch along a second horizontal axis direction Y in the first display area AA1. Here, the first horizontal axis direction X may be parallel to a first lengthwise direction X of the substrate 100, for example, a long side length direction of the substrate 100, and the second horizontal axis direction Y may be parallel to a second lengthwise direction Y of the substrate 100, for example, a short side length direction of the substrate 100. The first reference pixel pitch may be defined as a distance between center portions of two first unit pixels UP1 which are adjacent to each other along the first horizontal axis direction X, and the second reference pixel pitch may be defined as a distance between center portions of two first unit pixels UP1 which are adjacent to each other along the second horizontal axis direction Y.

The plurality of second unit pixels UP2 may be provided in the second display area AA2. In this case, the second unit pixels UP2 may each have a size which is less than that of each of the first unit pixels UP1. That is, a distance between a center portion of each of the second unit pixels UP2 and the outer surface of the substrate 100 may be set to half or less of each of the reference pixel pitches.

Adjacent first unit pixels UP1 and second unit pixels UP2 may be provided to have a reference pixel pitch. Therefore, in the light emitting diode display device according to the present embodiment, the plurality of first unit pixels UP1 provided on the substrate 100 may have the same size and may be arranged at the same reference pixel pitch, and in this case, a size of each of a plurality of second unit pixels UP2 adjacent to the outer surface of the substrate 100 is reduced, whereby the light emitting diode display device has a bezel width suitable for minimizing a boundary portion between display devices coupled to each other in a multi-screen display device.

The substrate 100 according to an embodiment may include a plurality of pixel driving lines and a plurality of subpixels SP1 to SP3.

The pixel driving lines may be provided on a front surface 100a of the substrate 100 and may supply signals necessary for each of the plurality of subpixels SP1 to SP3. The pixel driving lines according to an embodiment may include a plurality of gate lines GL, a plurality of data lines DL, a plurality of driving power lines DPL, and a plurality of common power lines CPL.

The plurality of gate lines GL may be provided on the front surface 100a of the substrate 100, may long extend along the first horizontal axis direction X of the substrate 100, may be arranged along the second horizontal axis direction Y, and may be spaced apart from each other by a certain interval.

The plurality of data lines DL may be provided on the front surface 100a of the substrate 100 to intersect the plurality of gate lines GL, may long extend along the second horizontal axis direction Y of the substrate 100, may be arranged along the first horizontal axis direction X, and may be spaced apart from each other by a certain interval.

The plurality of driving power lines DPL may be provided on the substrate 100 in parallel with the plurality of data lines DL and may be formed along with the plurality of data lines DL. Each of the plurality of driving power lines DPL may supply a pixel driving power, supplied from the outside, to an adjacent subpixel SP.

The plurality of common power lines CPL may be arranged on the substrate 100 in parallel with the plurality of gate lines GL and may be formed along with the plurality of gate lines GL. Each of the plurality of common power lines CPL may supply a common power, supplied from the outside, to adjacent subpixels SP1 to SP3.

The plurality of subpixels SP1 to SP3 may be respectively provided in a plurality of subpixel areas defined by intersections of the gate lines GL and the data lines DL. Each of the plurality of subpixels SP1 to SP3 may be defined as an area corresponding to a minimum unit where light is actually emitted.

At least three adjacent subpixels SP1 to SP3 may configure one unit pixel UP for displaying colors. For example, the one unit pixel UP may include a red subpixel SP1, a green subpixel SP2, and a blue subpixel SP3 which are adjacent to each other along the first horizontal axis direction X, and may further include a white subpixel for enhancing luminance.

At least three subpixels SP1 to SP3 which are provided adjacent to each other in the first display area AA1 may be defined as a first unit pixel UP1, and at least three subpixels SP1 to SP3 which are provided adjacent to each other in the second display area AA2 may be defined as a second unit pixel UP2.

Optionally, one driving power line DPL may be provided in each of the plurality of first unit pixels UP1, and one driving power line DPL may be provided in each of the plurality of second unit pixels UP2. In this case, the at least three subpixels SP1 to SP3 configuring each of unit pixels UP1 and UP2 may share one driving power line DPL. Therefore, the number of driving power lines for driving each of the subpixels SP1 to SP3 is reduced, and in proportion to the reduced number of the driving power lines, an aperture rate of each of the unit pixels UP1 and UP2 increases or a size of each of the unit pixels UP1 and UP2 decreases.

The plurality of subpixels SP1 to SP3 according to an embodiment may each include a pixel circuit PC, a concave portion 130, and a micro light emitting device 150.

The pixel circuit PC may be provided in a circuit area defined in each subpixel SP and may be connected to a gate line GL, a data line DL, and a driving power line DPL which are adjacent to the pixel circuit PC. The pixel circuit PC may control a current flowing in the micro light emitting device 150 according to a data signal supplied through the data line DL in response to a scan pulse supplied through the gate line GL, based on the pixel driving power supplied through the driving power line DPL. The pixel circuit PC according to an embodiment may include a switching TFT T1, a driving TFT T2, and a capacitor Cst.

The switching TFT T1 may include a gate electrode connected to the gate line GL, a first electrode connected to the data line DL, and a second electrode connected to a gate electrode N1 of the driving TFT T2. Here, each of the first and second electrodes of the switching TFT T1 may be a source electrode or a drain electrode according to a direction of a current. The switching TFT T1 may be turned on according to the scan pulse supplied through the gate line GL and may supply the data signal, supplied through the data line DL, to the driving TFT T2.

The driving TFT T2 may be turned on by a voltage supplied through the switching TFT T1 and/or a voltage of the capacitor Cst to control the amount of current flowing from the driving power line DPL to the micro light emitting device 150. To this end, the driving TFT T2 according to an embodiment may include a gate electrode connected to the second electrode N1 of the switching TFT T1, a drain electrode connected to the driving power line DPL, and a source electrode connected to the micro light emitting device 150. The driving TFT T2 may control a data current flowing from the driving power line DPL to the micro light emitting device 150 according to the data signal supplied through the switching TFT T1, thereby allowing the micro light emitting device 150 to emit light having brightness proportional to the data signal.

The capacitor Cst may be provided in an overlap area between the gate electrode N1 and the source electrode of the driving TFT T2, may store a voltage corresponding to the data signal supplied to the gate electrode of the driving TFT T2, and may turn on the driving TFT T2 with the stored voltage.

Optionally, the pixel circuit PC may further include at least one compensation TFT for compensating for a threshold voltage shift of the driving TFT T2, and moreover, may further include at least one auxiliary capacitor. The pixel circuit PC may be additionally supplied with a compensation power such as an initialization voltage, based on the number of TFTs and auxiliary capacitors. Therefore, the pixel circuit PC according to the present embodiment may drive the micro light emitting device 150 through a current driving manner identically to each subpixel of an organic light emitting display device, and thus, may be replaced with a pixel circuit of organic light emitting display devices known to those skilled in the art.

The concave portion 130 may be provided in each of the plurality of subpixels SP1 to SP3 and may be concavely provided for accommodating the micro light emitting device 150. In a process of mounting the micro light emitting device 150 on each of the plurality of subpixels SP1 to SP3, the concave portion 130 prevents deviation of the micro light emitting device 150 and enhances an alignment precision of the micro light emitting device 150.

The micro light emitting device 150 may be mounted on the concave portion 130 provided in each of the plurality of subpixels SP1 to SP3. The micro light emitting device 150 may be electrically connected to the pixel circuit PC of a corresponding subpixel SP and a corresponding common power line CPL, and thus, may emit light with a current flowing from the pixel circuit PC (i.e., the driving TFT T2) to the common power line CPL. The micro light emitting device 150 according to an embodiment may be a micro light emitting device or a micro light emitting diode chip which emits one of red light, green light, blue light, and white light. For example, the micro light emitting device 150 may be a micro light emitting device or a micro light emitting diode chip. Here, the micro light emitting diode chip may have a scale of 1 μm to 100 μm, but is not limited thereto. In other embodiments, the micro light emitting diode chip may have a size which is less than that of an emissive area other than a circuit area occupied by the pixel circuit PC in a corresponding subpixel area.

The light emitting diode display device according to the present embodiment may further include a display driving circuit.

The display driving circuit may be disposed on a rear surface of the substrate 100 and may allow the micro light emitting device 150 of each subpixel SP to emit light. The display driving circuit according to an embodiment may include a plurality of first pad parts PP1, a plurality of first routing lines RL1, a plurality of second pad parts PP2, a plurality of second routing lines RL2, a data driving circuit 210, a gate driving circuit 230, a control board 250, and a timing controller 270.

The plurality of first pad parts PP1 may be arranged at certain intervals on a first side rear edge of the substrate 100. The plurality of first pad parts PP1 may each include a plurality of first pads.

The plurality of first routing lines RL1 may be electrically connected to respective ends of a plurality of pixel driving lines (in more detail, the plurality of data lines DL) provided on the front surface 100a of the substrate 100, and moreover, may be provided on in a first non-display area IA and a first outer surface of the substrate 100 and a rear edge of the substrate 100 and may be electrically connected to the plurality of first pad parts PP1. That is, the plurality of first routing lines RL1 may be provided to surround the first outer surface of the substrate 100, one ends of the first routing lines RL1 may be respectively connected to the plurality of data lines DL in the first non-display area IA in a one-to-one relationship, and the other ends of the first routing lines RL1 may be respectively connected to the first pads of a corresponding first pad part PP1 provided on a rear surface 100b of the substrate 100. Here, the first non-display area IA of the substrate 100 may be a lower edge area of the substrate 100 illustrated in FIG. 1.

The plurality of second pad parts PP2 may be arranged at certain intervals on a second side rear edge of the substrate 100. The plurality of second pad parts PP2 may each include a plurality of second pads.

The plurality of second routing lines RL2 may be electrically connected to respective ends of a plurality of pixel driving lines (in more detail, the plurality of gate lines GL) provided on the front surface 100a of the substrate 100, and moreover, may be provided on in a second non-display area IA and a second outer surface of the substrate 100 and the rear edge of the substrate 100 and may be electrically connected to the plurality of second pad parts PP2. That is, the plurality of second routing lines RL2 may be provided to surround the second outer surface of the substrate 100, one ends of the second routing lines RL2 may be respectively connected to the plurality of gate lines GL in the second non-display area IA in a one-to-one relationship, and the other ends of the second routing lines RL2 may be respectively connected to the second pads of a corresponding second pad part PP2 provided on the rear surface 100b of the substrate 100. Here, the second non-display area IA of the substrate 100 may be a right edge area of the substrate 100 illustrated in FIG. 1.

The data driving circuit 210 may include a plurality of data flexible circuit films 211 and a plurality of data driving integrated circuits (ICs) 213.

The plurality of data flexible circuit films 211 may be respectively attached on, through a film attachment process, the plurality of first pad parts PP1 provided on the rear surface 100b of the substrate 100 in a one-to-one relationship.

Each of the plurality of data driving ICs 213 may be individually mounted on a corresponding data flexible circuit film of the plurality of data flexible circuit films 211. The data driving ICs 213 may receive subpixel data and a data control signal supplied from the timing controller 270, convert the subpixel data into analog data voltages by subpixels according to the data control signal, and respectively supply the analog data voltages to the data lines DL.

Optionally, the plurality of data driving ICs 213 may be directly mounted on the rear surface 100b of the substrate 100 so as to be respectively connected to the plurality of first pad parts PP1 in a one-to-one relationship without being mounted on the data flexible circuit films 211. Here, the plurality of data driving ICs 213 may be mounted on the rear surface 100b of the substrate 100 through a chip mounting process based on a chip-on glass (COG) type. In this case, the data flexible circuit films 211 may be removed, and thus, a configuration of the data driving circuit 210 is simplified.

The gate driving circuit 230 may include a plurality of gate flexible circuit films 231 and a plurality of gate driving ICs 233.

The plurality of gate flexible circuit films 231 may be respectively attached on, through a film attachment process, the plurality of second pad parts PP2 provided on the rear surface 100b of the substrate 100 in a one-to-one relationship.

Each of the plurality of gate driving ICs 233 may be individually mounted on a corresponding gate flexible circuit film of the plurality of gate flexible circuit films 231. Each of the gate driving ICs 233 may generate a scan pulse, based on a gate control signal supplied from the timing controller 270 and may supply the generated scan pulse to a corresponding gate line GL corresponding to a predetermined order.

Optionally, the plurality of gate driving ICs 233 may be directly mounted on the rear surface 100b of the substrate 100 so as to be respectively connected to the plurality of second pad parts PP2 in a one-to-one relationship without being mounted on the gate flexible circuit films 231. Here, the plurality of gate driving ICs 233 may be mounted on the rear surface 100b of the substrate 100 through a chip mounting process based on a COG type. In this case, the gate flexible circuit films 231 may be removed, and thus, a configuration of the gate driving circuit 230 is simplified.

The control board 250 may be connected to the plurality of data flexible circuit films 211 and the plurality of gate flexible circuit films 231. For example, the control board 250 may be electrically connected to the plurality of data flexible circuit films 211 through a plurality of first signal transmission cables STC1 and may be electrically connected to the plurality of gate flexible circuit films 231 through a plurality of second signal transmission cables STC2. The control board 250 may support the timing controller 270 and may transfer signals and power between the elements of the display driving circuit.

The timing controller 270 may be mounted on the control board 250 and may receive image data and a timing synchronization signal supplied from a display driving system through a user connector provided on the control board 250. The timing controller 270 may align the image data according to a subpixel arrangement structure of the first and second display areas AA1 and AA2 based on the timing synchronization signal to generate subpixel data and may supply the generated subpixel data to the data driving ICs 213. Also, the timing controller 270 may generate the data control signal and the gate control signal, based on the timing synchronization signal and may control a driving timing of each of the data driving ICs 213 and the gate driving ICs 233.

Optionally, the plurality of data driving ICs 213, the plurality of gate driving ICs 233, and the timing controller 270 may be integrated into one integration driving IC. In this case, the one integration driving IC may be mounted on the rear surface 100b of the substrate 100, and each of the plurality of first routing lines RL1 and the plurality of second routing lines RL2 may be additionally routed on the rear surface 100b of the substrate 100 and may be electrically connected to a corresponding channel provided in the integration driving IC. In this case, the plurality of first pad parts PP1, the plurality of second pad parts PP2, the plurality of data flexible circuit films 211, and the plurality of gate flexible circuit films 231 may be omitted.

In addition, in the present embodiment, corners of the substrate 100 may be chamfered to have a certain angle or length, or may be rounded to have a certain curvature. Therefore, in the present embodiment, the plurality of first routing lines RL1 and the plurality of second routing lines RL2 may be easily formed in the corners and outer surface of the substrate 100 without disconnection.

In the light emitting diode display device according to the present embodiment, a size of the second unit pixel UP2 provided in the second display area AA2 overlapping the edge of the substrate 100 may be set less than that of the first unit pixel UP1 provided in the first display area AA1 of the substrate 100, and thus, the light emitting diode display device has a bezel width suitable for minimizing a boundary portion between display devices coupled to each other in a multi-screen display device. That is, in the light emitting diode display device according to the present embodiment, a size of each of the plurality of second unit pixels UP2 adjacent to the outer surface of the substrate 100 is reduced, and the display driving circuit may be provided on the rear surface of the substrate 100, thereby minimizing a bezel area of the substrate 100. Also, since the micro light emitting device 150 is accommodated into the concave portion 130 provided in each of the subpixels SP1 to SP3, alignment precision is enhanced in the mounting (or transfer) process for the micro light emitting device 150, and thus, productivity is enhanced.

Figure 4:
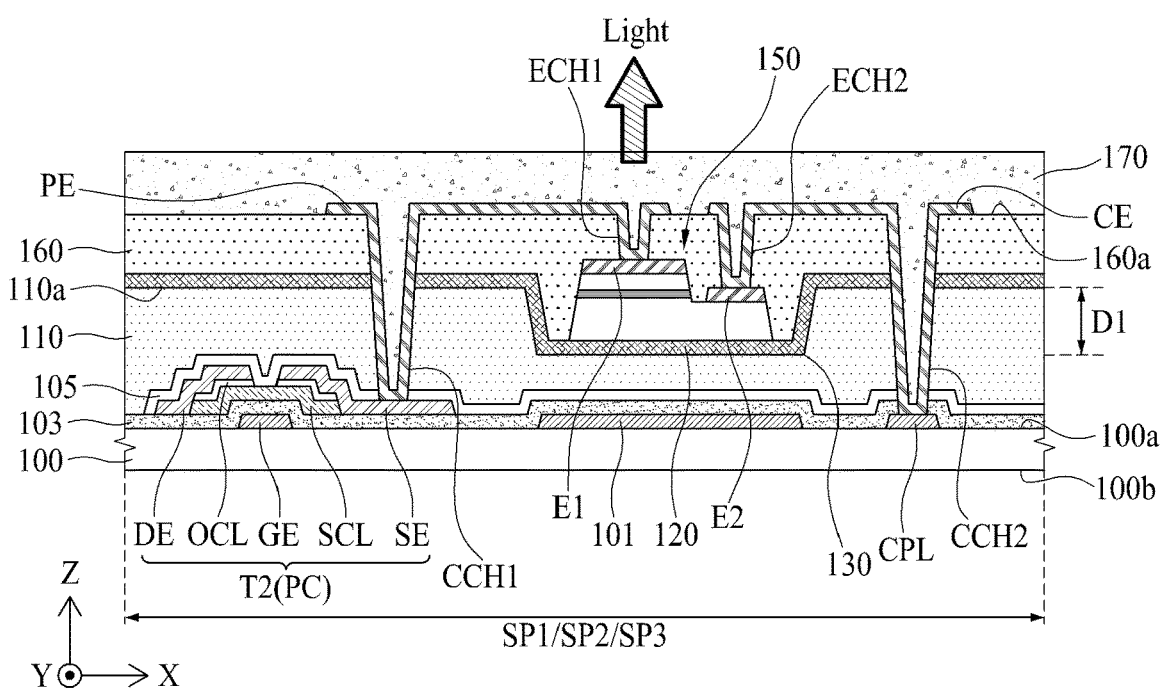
FIG. 4 is a cross-sectional view for describing a structure of one subpixel illustrated in FIG. 3.
Figure 5:
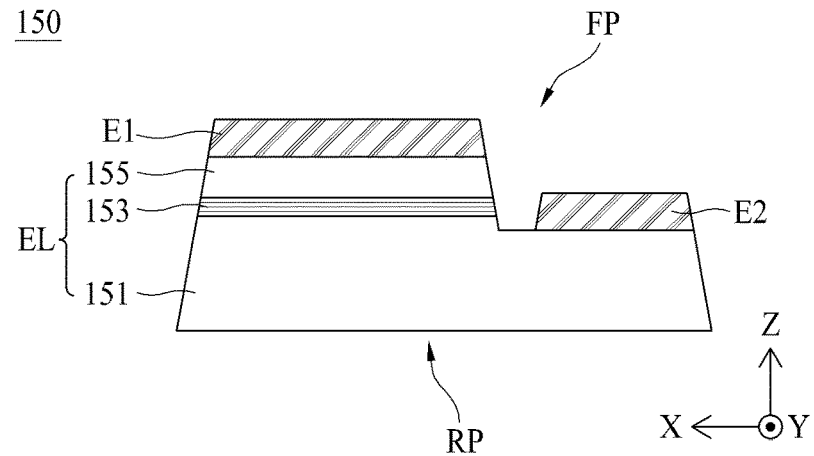
FIG. 5 is a cross-sectional view for describing a structure of a micro light emitting device illustrated in FIG. 4.

FIG. 4 is a cross-sectional view for describing a structure of one subpixel illustrated in FIG. 3, and FIG. 5 is a cross-sectional view for describing a structure of a micro light emitting device illustrated in FIG. 4.

Referring to FIGS. 4 and 5 along with FIG. 3, a plurality of subpixels SP1 to SP3 of a light emitting diode display device according to the present embodiment may each include a pixel circuit PC, a passivation layer 110, a concave portion 130, a micro light emitting device 150, a planarization layer 160, a pixel electrode PE, and a common electrode CE.

First, in FIG. 4, a thickness of a substrate 100 is relatively thinly illustrated, but the substrate 100 may substantially have a thickness which is relatively much thicker than a total thickness of a layered structure provided on the substrate 100.

The pixel circuit PC may include a switching TFT T1, a driving TFT T2, and a capacitor Cst. The pixel circuit PC is as described above, and thus, its detailed description is not provided. Hereinafter, a structure of the driving TFT T2 will be described for example.

The driving TFT T2 may include a gate electrode GE, a semiconductor layer SCL, an ohmic contact layer OCL, a source electrode SE, and a drain electrode DE.

The gate electrode GE may be formed on the substrate 100 along with the gate line GL. The gate electrode GE may be covered by a gate insulation layer 103. The gate insulation layer 103 may be formed of a single layer or a multilayer including an inorganic material and may be formed of silicon oxide (SiOx) silicon nitride (SiNx), and/or the like.

The semiconductor layer SCL may be provided in a predetermined pattern (or island) type on the gate insulation layer 103 to overlap the gate electrode GE. The semiconductor layer SCL may be formed of a semiconductor material including one of amorphous silicon, polycrystalline silicon, oxide, and an organic material, but is not limited thereto.

The ohmic contact layer OCL may be provided in a predetermined pattern (or island) type on the semiconductor layer SCL. Here, the ohmic contact layer OCL is for an ohmic contact between the semiconductor layer SCL and the source and drain electrodes SE and DE and may be omitted.

The source electrode SE may be formed on one side of the ohmic contact layer OCL to overlap one side of the semiconductor layer SCL. The source electrode SE may be formed along with the data lines DL and the driving power lines DPL.

The drain electrode DE may be formed on the other side of the ohmic contact layer OCL to overlap the other side of the semiconductor layer SCL and may be spaced apart from the source electrode SE. The drain electrode DE may be formed along with the source electrode SE and may branch or protrude from an adjacent driving power line DPL.

In addition, the switching TFT T1 configuring the pixel circuit PC may be formed in a structure which is the same as that of the driving TFT T2. In this case, the gate electrode of the switching TFT T1 may branch or protrude from the gate line GL, the first electrode of the switching TFT T1 may branch or protrude from the data line DL, and the second electrode of the switching TFT T1 may be connected to the gate electrode GE of the driving TFT T2 through a via hole provided in the gate insulation layer 103.

The pixel circuit PC may be covered by an interlayer insulation layer 105. The interlayer insulation layer 105 may be provided all over the substrate 100 to cover the pixel circuit PC including the driving TFT T2. The interlayer insulation layer 105 according to an embodiment may be formed of an inorganic material, such as SiOx or SiNx, or an organic material such as benzocyclobutene or photo acryl. The interlayer insulation layer 105 may not be provided.

The passivation layer 110 may be provided all over the substrate 100 to cover the subpixel SP (i.e., the pixel circuit PC), or may be provided all over the substrate 100 to cover the interlayer insulation layer 105. The passivation layer 110 may protect the pixel circuit PC including the driving TFT T2 and may provide a planar surface on the interlayer insulation layer 105. The passivation layer 110 according to an embodiment may be formed of an organic material such as benzocyclobutene or photo acryl, and particularly, may be formed of photo acryl for convenience of a process.

The concave portion 130 may be provided in an emissive area of a subpixel area defined in the subpixel SP and may accommodate the micro light emitting device 150. The concave portion 130 according to an embodiment may be provided concavely from the passivation layer 110 to have a certain depth D1. In this case, the concave portion 130 may include an accommodating space which is provided concavely from a top 110a of the passivation layer 110 to have a depth D1 corresponding to a thickness (or a total height) of the micro light emitting device 150. Here, a floor surface of the concave portion 130 may be formed by removing a portion of the passivation layer 110, a whole portion of the passivation layer 110, the whole portion of the passivation layer 110 and a portion of the interlayer insulation layer 105, or a whole portion of each of the passivation layer 110, the interlayer insulation layer 105, and the gate insulation layer 103 in order to have the depth D1 which is set based on the thickness of the micro light emitting device 150. For example, the concave portion 130 may be provided to have a depth of 2 μm to 6 μm from the top 110a of the passivation layer 110. The concave portion 130 may have a groove or cup shape having a size which is wider than a rear surface (or a bottom) of the micro light emitting device 150.

The concave portion 130 according to an embodiment may include an inclined surface provided between the floor surface and the top 110a of the passivation layer 110, and the inclined surface may allow light emitted from the micro light emitting device 150 to travel toward the front of concave portion 130.

The micro light emitting device 150 may be mounted on the concave portion 130 and may be electrically connected to the pixel circuit PC and a common power line CPL, and thus, may emit light with a current flowing from the pixel circuit PC (i.e., the driving TFT T2) to the common power line CPL. The micro light emitting device 150 according to an embodiment may include a light emitting layer EL, a first electrode (or an anode terminal) E1, and a second electrode (or a cathode terminal) E2.

The light emitting layer EL may emit light according to a recombination of an electron and a hole based on a current flowing between the first electrode E1 and the second electrode E2. The light emitting layer EL according to an embodiment may include a first semiconductor layer 151, an active layer 153, and a second semiconductor layer 155.

The first semiconductor layer 151 may supply an electron to the active layer 153. The first semiconductor layer 151 according to an embodiment may be formed of an n-GaN-based semiconductor material, and examples of the n-GaN-based semiconductor material may include GaN, AlGaN, InGaN, AlInGaN, etc. Here, silicon (Si), germanium (Ge), selenium (Se), tellurium (Te), or carbon (C) may be used as impurities used for doping of the first semiconductor layer 151.

The active layer 153 may be provided on one side of the first semiconductor layer 151. The active layer 153 may have a multi quantum well (MQW) structure which includes a well layer and a barrier layer which is higher in band gap than the well layer. The active layer 153 according to an embodiment may have an MQW structure of InGaN/GaN or the like.

The second semiconductor layer 155 may be provided on the active layer 153 and may supply a hole to the active layer 153. The second semiconductor layer 155 according to an embodiment may be formed of a p-GaN-based semiconductor material, and examples of the p-GaN-based semiconductor material may include GaN, AlGaN, InGaN, AlInGaN, etc. Here, magnesium (Mg), zinc (Zn), or beryllium (Be) may be used as impurities used for doping of the second semiconductor layer 155.

The first electrode E1 may be provided on the second semiconductor layer 155. The first electrode E1 may be connected to the source electrode SE of the driving TFT T2.

The second electrode E2 may be provided on the other side of the first semiconductor layer 151 and may be electrically disconnected from the active layer 153 and the second semiconductor layer 155. The second electrode E2 may be connected to the common power line CPL.

Each of the first and second electrodes E1 and E2 according to an embodiment may be formed of a material including one or more materials of a metal material, such as gold (Au), tungsten (W), platinum (Pt), silicon (Si), iridium (Ir), silver (Ag), copper (Cu), nickel (Ni), titanium (Ti), or chromium (Cr), and an alloy thereof. In other embodiments, each of the first and second electrodes E1 and E2 may be formed of a transparent conductive material, and examples of the transparent conductive material may include indium tin oxide (ITO), indium zinc oxide (IZO), etc. However, the present embodiment is not limited thereto.

In addition, the first semiconductor layer 151, the active layer 153, and the second semiconductor layer 155 may be provided in a structure of being sequentially stacked on a semiconductor substrate. Here, the semiconductor substrate may include a semiconductor material included in a sapphire substrate or a silicon substrate. The semiconductor substrate may be used as a growth semiconductor substrate for growing each of the first semiconductor layer 151, the active layer 153, and the second semiconductor layer 155, and then, may be separated from the first semiconductor layer 151 through a substrate separation process. Here, the substrate separation process may be a laser lift-off process or a chemical lift-off process. Therefore, since the growth semiconductor substrate is removed from the micro light emitting device 150, the micro light emitting device 150 has a thin thickness, and thus, may be accommodated into the concave portion 130 provided in each subpixel SP.

The micro light emitting device 150 may emit the light according to the recombination of the electron and the hole based on the current flowing between the first electrode E1 and the second electrode E2. In this case, the light emitted from the micro light emitting device 150 may pass through the first and second electrodes E1 and E2 and may be output to the outside. In other words, the light emitted from the micro light emitting device 150 may pass through the first and second electrodes E1 and E2 and may be output in a second direction opposite to a first direction toward the floor surface of the concave portion 130, thereby displaying an image.

The micro light emitting device 150 may include a first portion (or a front portion) FP, including the first and second electrodes E1 and E2 connected to the pixel circuit PC, and a second portion (or a rear portion) RP opposite to the first portion FP. In this case, the first portion FP may be disposed relatively farther away from the floor surface of the concave portion 130 than the second portion RP. Here, the first portion FP may have a size which is less than that of the second portion RP, and in this case, the micro light emitting device 150 may have a cross-sectional surface having a trapezoid shape which includes a top corresponding to the first portion FP and a bottom corresponding to the second portion RP.

The planarization layer 160 may be provided on the passivation layer 110 to cover the micro light emitting device 150. That is, the planarization layer 160 may be provided on the passivation layer 110 to have a thickness which enables the planarization layer 160 to cover a top of the passivation layer 110 and a front surface of the other accommodating space of the concave portion 130 into which the micro light emitting device 150 is accommodated.

The planarization layer 160 may provide a planarization surface on the passivation layer 110. Also, the planarization layer 160 may be buried into the other accommodating space of the concave portion 130 into which the micro light emitting device 150 is accommodated, thereby fixing a position of the micro light emitting device 150.

The pixel electrode PE may electrically connect the first electrode E1 of the micro light emitting device 150 to the source electrode SE of the driving TFT T2 and may be defined as an anode electrode. The pixel electrode PE according to an embodiment may be provided on a top 160a of the planarization layer 160 overlapping the driving TFT T2 and the first electrode E1 of the micro light emitting device 150. The pixel electrode PE may be electrically connected to the source electrode SE of the driving TFT T2 through a first circuit contact hole CCH1 which is provided to pass through the interlayer insulation layer 105, the passivation layer 110, and the planarization layer 160, and may be electrically connected to the first electrode E1 of the micro light emitting device 150 through a first electrode contact hole ECH1 provided in the planarization layer 160. Therefore, the first electrode E1 of the micro light emitting device 150 may be electrically connected to the source electrode SE of the driving TFT T2 through the pixel electrode PE. If the light emitting diode display device has a top emission structure, the pixel electrode PE may be formed of a transparent conductive material, and if the light emitting diode display device has a bottom emission structure, the pixel electrode PE may be formed of a light reflection conductive material. Here, the transparent conductive material may be indium tin oxide (ITO), indium zinc oxide (IZO), or the like, but is not limited thereto. The light reflection conductive material may be Al, Ag, Au, Pt, Cu, or the like, but is not limited thereto. The pixel electrode PE including the light reflection conductive material may be formed of a single layer including the light reflection conductive material or a multilayer including a plurality of the single layers which are stacked.

The common electrode CE may be electrically connected to the second electrode E2 of the micro light emitting device 150 and the common power line CPL and may be defined as a cathode electrode. The common electrode CE may be provided on the top 160a of the planarization layer 160 overlapping the second electrode E2 of the micro light emitting device 150 and the common power line CPL. Here, the common electrode CE may be formed of a material which is the same as that of the pixel electrode PE.

One side of the common electrode CE according to an embodiment may be electrically connected to the common power line CPL through a second circuit contact hole CCH2 which is provided to pass through the gate insulation layer 103, the interlayer insulation layer 105, the passivation layer 110, and the planarization layer 160. The other side of the common electrode CE may be electrically connected to the second electrode E2 of the micro light emitting device 150 through a second electrode contact hole ECH2 which is provided in the planarization layer 160 to overlap the second electrode E2 of the micro light emitting device 150. Therefore, the second electrode E2 of the micro light emitting device 150 may be electrically connected to the common power line CPL through the common electrode CE.

The pixel electrode PE and the common electrode CE according to an embodiment may be simultaneously provided through an electrode patterning process using a lithography process, an etching process, and a deposition process of depositing an electrode material on the planarization layer 160 including the first and second circuit contact holes CCH1 and CCH2 and the first and second electrode contact holes ECH1 and ECH2. Therefore, in the present embodiment, since the common electrode CE and the pixel electrode PE connecting the micro light emitting device 150 and the pixel circuit PC are simultaneously formed, an electrode connection process is simplified, and a process time taken in a process of connecting the micro light emitting device 150 and the pixel circuit PC is considerably shortened, thereby enhancing a productivity of the light emitting diode display device.

The light emitting diode display device according to the present embodiment may further include a transparent buffer layer 170.

The transparent buffer layer 170 may be provided on the substrate 100 to cover a whole portion of the planarization layer 160 where the pixel electrode PE and the common electrode CE are provided, and thus, may provide a planarization surface on the planarization layer 160, thereby protecting the micro light emitting device 150 and the pixel circuit PC from an external impact. Therefore, the pixel electrode PE and the common electrode CE may be provided between the planarization layer 160 and the transparent buffer layer 170. The transparent buffer layer 170 may be an optical clear adhesive (OCA) or an optical clear resin (OCR), but is not limited thereto.

The light emitting diode display device according to the present embodiment may further include a reflective layer 101 provided under an emissive area of each subpixel SP.

The reflective layer 101 may be provided between the floor surface of the concave portion 130 and the substrate 100 to overlap the emissive area including the micro light emitting device 150. The reflective layer 101 according to an embodiment may be formed of a material which is the same as that of the gate electrode GE of the driving TFT T2, and may be provided on the same layer as the gate electrode GE. The reflective layer 101 may reflect light, which is incident from the micro light emitting device 150, toward the first portion FP of the micro light emitting device 150. Accordingly, the light emitting diode display device according to the present embodiment may include the reflective layer 101, and thus, may have a top emission structure. However, if the light emitting diode display device according to the present embodiment has a bottom emission structure, the reflective layer 101 may be omitted.

Optionally, the reflective layer 101 may be formed of a material which is the same as that of the source/drain electrode SE/DE of the driving TFT T2, and may be provided on the same layer as the source/drain electrode SE/DE.

In the light emitting diode display device according to the present embodiment, the micro light emitting device 150 mounted in each subpixel SP may be adhered to the floor surface of the concave portion 130 by an adhesive member 120.

The adhesive member 120 may be disposed between the concave portion 130 of each subpixel SP and the micro light emitting device 150 and may attach the micro light emitting device 150 on the floor surface of the concave portion 130, thereby primarily fixing the micro light emitting display device 150.

The adhesive member 120 according to an embodiment may be attached (coated) on the second portion RP of the micro light emitting device 150 (i.e., a back surface of the first semiconductor layer 151), and thus, in a mounting process of mounting the micro light emitting device 150 onto the concave portion 130, the adhesive member 120 may be adhered to the concave portion 130 of each subpixel SP.

In other embodiments, the adhesive member 120 may be dotted onto the concave portion 130 of each subpixel SP and may be spread by pressure which is applied to the adhesive member 120 in a mounting process performed for the micro light emitting device 150, and thus, may be adhered to the second portion RP of the micro light emitting device 150. Therefore, the micro light emitting device 150 mounted on the concave portion 130 may be primarily position-fixed by the adhesive member 120. Accordingly, according to the present embodiment, the mounting process for the micro light emitting device 150 may be performed in a method of simply attaching the micro light emitting device 150 on the floor surface of the concave portion 130, and thus, a mounting process time taken in performing the mounting process for the micro light emitting device 150 is shortened.

In other embodiments, the adhesive member 120 may be coated on the top 110a of the passivation layer 110 and the floor surface and an inclined surface of the concave portion 130. That is, the adhesive member 120 may be provided to wholly cover a portion of a front surface of the passivation layer 110 except the contact holes. In other words, the adhesive member 120 may be disposed between the passivation layer 110 and the planarization layer 160 and may be disposed between the passivation layer 110 and the micro light emitting device 150. In other embodiments, the adhesive member 120 may be coated on the whole top 110a of the passivation layer 110, where the concave portion 130 is provided, to a certain thickness. A portion of the adhesive member 120 coated on the top 110a of the passivation layer 110, where the contact holes are to be provided, may be removed when forming the contact holes. Therefore, in the present embodiment, immediately before a mounting process for the micro light emitting device 150, the adhesive member 120 may be coated on the whole top 110a of the passivation layer 110 to have a certain thickness, and thus, according to the present embodiment, a process time taken in forming the adhesive member 120 is shortened.

In the present embodiment, the adhesive member 120 may be provided on the whole top 110a of the passivation layer 110, and thus, the planarization layer 160 according to the present embodiment is provided to cover the adhesive member 120.

A mounting process for a micro light emitting device according to an embodiment may include a process of mounting a red micro light emitting device on each of red subpixels SP1, a process of mounting a green micro light emitting device on each of green subpixels SP2, and a process of mounting a blue micro light emitting device on each of blue subpixels SP3, and moreover, may further include a process of mounting a white micro light emitting device on each of white subpixels.

The mounting process for the micro light emitting device according to an embodiment may include only a process of mounting the white micro light emitting device on each of subpixels. In this case, the substrate 100 may include a color filter layer overlapping each subpixel. The color filter layer may transmit only light, having a wavelength of a color corresponding to a corresponding subpixel, of white light.

The mounting process for the micro light emitting device according to an embodiment may include only a process of mounting a first-color micro light emitting device on each subpixel. In this case, the substrate 100 may include a wavelength conversion layer and the color filter layer overlapping each subpixel. The wavelength conversion layer may emit light of a second color, based on some of light of the first color incident from the first-color micro light emitting device. The color filter layer may transmit only light, having a wavelength of a color corresponding to a corresponding subpixel, of white light based on a combination of the light of the first color and the light of the second color. Here, the first color may be blue, and the second color may be yellow. The wavelength conversion layer may include a phosphor or a quantum dot which emits the light of the second color, based on some of the light of the first color.

Figure 6:
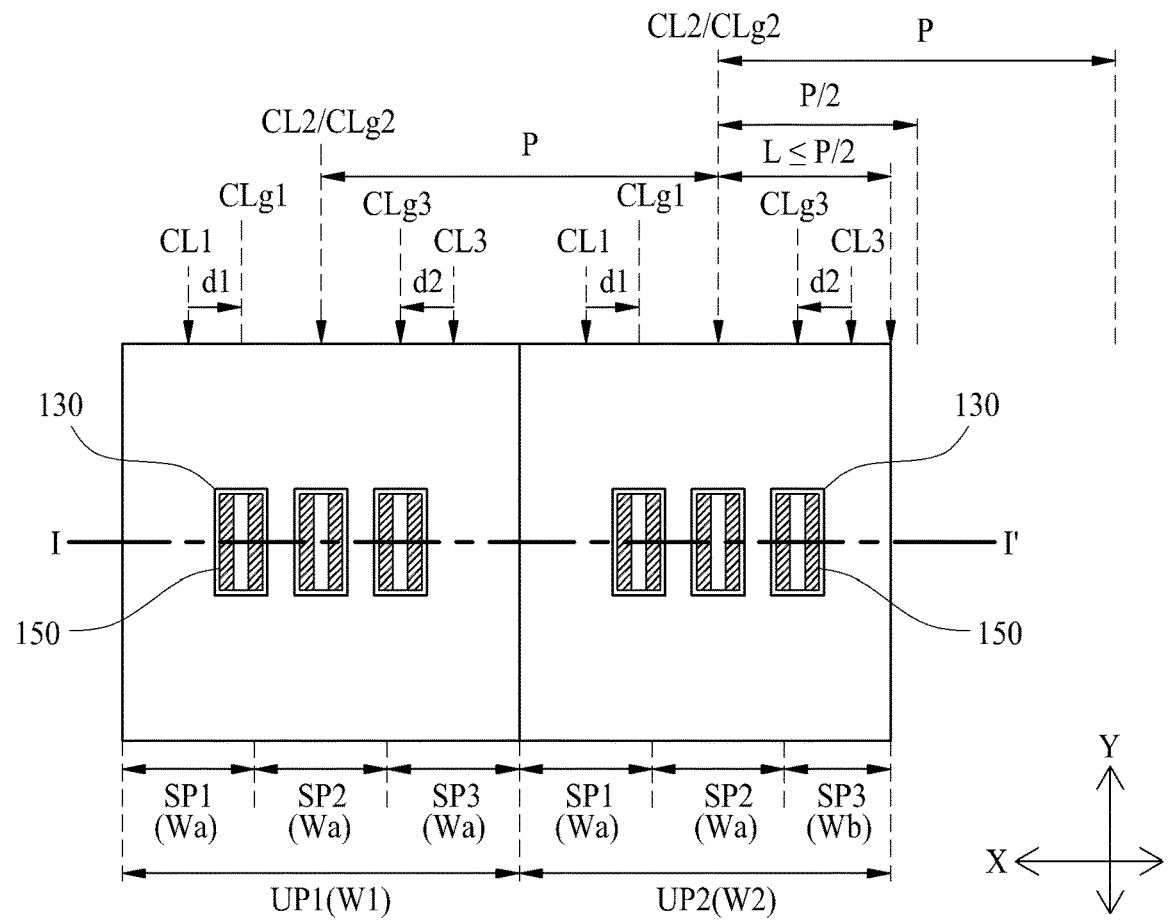
FIG. 6 is a plan view for describing a concave portion provided in a unit pixel according to an embodiment of the present disclosure.
Figure 7:
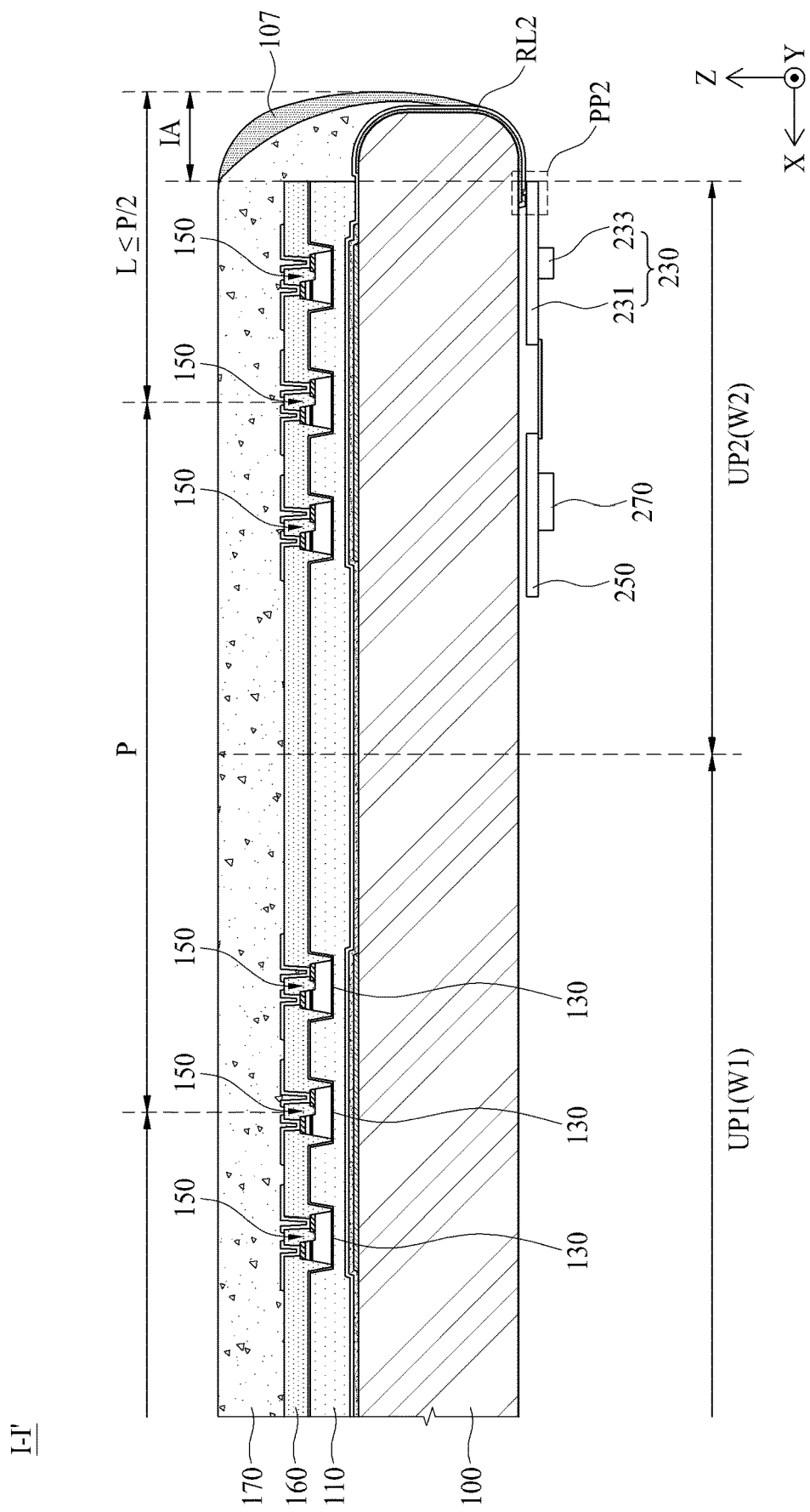
FIG. 7 is a cross-sectional view taken along line I-I' illustrated in FIG. 6.

FIG. 6 is a plan view for describing a concave portion provided in a unit pixel according to an embodiment of the present disclosure, and FIG. 7 is a cross-sectional view taken along line I-I' illustrated in FIG. 6.

Referring to FIGS. 6 and 7, in the present embodiment, first to third subpixels SP1 to SP3 configuring each of a plurality of first unit pixels UP1 may each include a concave portion 130 which is provided concavely from a top of a passivation layer 110.

First, in each of the first unit pixels UP1, the second subpixel SP2 may be provided in the middle of a unit pixel area, the first subpixel SP1 may be provided on one side of the second subpixel SP2, and the third subpixel SP3 may be provided on the other side of the second subpixel SP2.

The concave portion 130 provided in the second subpixel SP2 may have a planarly tetragonal shape, and a center line CLg2 of the concave portion 130 with respect to a first horizontal axis direction X may match a second center line CL2 of the second subpixel SP2. For example, the concave portion 130 of the second subpixel SP2 may be provided in a center portion of the first unit pixel UP1. Therefore, a distance L between a center portion of the concave portion 130 provided in the second subpixel SP2 and an outer surface of a substrate 100 may be set to half "P/2" or less of a reference pixel pitch P.

The concave portion 130 provided in the first subpixel SP1 may have a planarly tetragonal shape and may be provided close to the concave portion 130 provided in the second subpixel SP2. That is, a center line CLg1 of the concave portion 130 provided in the first subpixel SP1 with respect to the first horizontal axis direction X may be provided at a position which is spaced apart from a center line CL1 of the first subpixel SP1 by a first distance d1 in a direction toward the second subpixel SP2.

The concave portion 130 provided in the third subpixel SP3 may have a planarly tetragonal shape and may be provided close to the concave portion 130 provided in the second subpixel SP2. That is, a center line CLg3 of the concave portion 130 provided in the third subpixel SP3 with respect to the first horizontal axis direction X may be provided at a position which is spaced apart from a center line CL3 of the third subpixel SP3 by a second distance d2 in a direction toward the second subpixel SP2.

The first to third subpixels SP1 to SP3 of each of the first unit pixels UP1 may have the same width Wa with respect to the first horizontal axis direction X.

In each of the first unit pixels UP1, the concave portions 130 respectively provided in the first to third subpixels SP1 to SP3 may be provided to concentrate on a center portion of the first unit pixel UP1. Each first unit pixel UP1 may have a first width W1 corresponding to a predetermined resolution, and the plurality of first unit pixels UP1 may be arranged at the reference pixel pitch P. Here, the reference pixel pitch P may be defined as a distance between center portions of two first unit pixels UP1 which are adjacent to each other with respect to the first horizontal axis direction X and a second horizontal axis direction Y. In other words, the reference pixel pitch P may be defined as a distance between the same subpixels provided in two first unit pixels UP1 which are adjacent to each other with respect to the first horizontal axis direction X. That is, the reference pixel pitch P may be defined as a distance between micro light emitting devices 150 respectively provided in second subpixels SP2 of two adjacent first unit pixels UP1. For example, the first unit pixel UP1 may be configured with a red subpixel SP1, a green subpixel SP2, and a blue subpixel SP3, and in this case, the reference pixel pitch P may be a distance between concave portions 130 (or micro light emitting devices 150) respectively provided in adjacent red subpixels SP1, a distance between concave portions 130 (or micro light emitting devices 150) respectively provided in adjacent green subpixels SP2, or a distance between concave portions 130 (or micro light emitting devices 150) respectively provided in adjacent blue subpixels SP3, with respect to the first horizontal axis direction X.

In each of the plurality of second unit pixels UP2, the second subpixel SP2 may be provided in the middle of a unit pixel area, the first subpixel SP1 may be provided on one side of the second subpixel SP2, and the third subpixel SP3 may be provided on the other side of the second subpixel SP2 and may be provided adjacent to the outer surface of the substrate 100. Here, the outer surface of the substrate 100 may be defined as a side wall vertical to an end of a front surface 100a of the substrate 100, or may be defined as an outermost surface of the substrate 100 exposed to the outside. That is, the side wall of the substrate 100 may be directly exposed to the outside, or may be covered by structures such as a routing line, a passivation layer, etc., and thus may not be directly exposed to the outside. Therefore, the outer surface of the substrate 100 may be defined as the outermost surface of the substrate 100 exposed to the outside.

The concave portions 130 respectively provided in the first to third subpixels SP1 to SP3 in each second unit pixel UP2 are the same as the concave portions of the first unit pixels UP1, and thus, their repetitive descriptions are not provided.

In each of the second unit pixels UP2, since each of the first and second subpixels SP1 and SP2 is adjacent to a corresponding first unit pixel UP1, each of the first and second subpixels SP1 and SP2 may be provided to have the width Wa which is the same as that of each of subpixels of the corresponding first unit pixel UP1.

On the other hand, the third subpixel SP3 of each second unit pixel UP2 may be provided to have a width Wb which is narrower than the width Wa of each of the first and second subpixels SP1 and SP2. In detail, in each second unit pixel UP2, the concave portions 130 may be provided to concentrate on center portions of unit pixels, and thus, even when a portion of an area of the third subpixel SP3 adjacent to the non-display area IA of the substrate 100 is removed, the quality of an image displayed on a corresponding unit pixel UP2 is not affected. Therefore, the width Wb of the third subpixel SP3 with respect to the first horizontal axis direction X may be reduced by the second distance d2 at which the micro light emitting device 150 mounted on the third subpixel SP3 is disposed close to the second subpixel SP2 with respect to the center line CL3 of the third subpixel SP3. In this case, a maximum distance L between the second unit pixel UP2 and the outer surface of the substrate 100 may be set to half "P/2" or less of the reference pixel pitch P at which the plurality of first unit pixels UP1 are arranged, namely, may be set equal to or less than half of the reference pixel pitch P. Therefore, since a size of each of the third subpixels SP3 is reduced in the second unit pixels UP2 adjacent to a bezel area of the substrate 100, the light emitting diode display device according to the present embodiment has a bezel width suitable for a boundary portion between display devices connected to each other in a multi-screen display device.

In addition, the light emitting diode display device according to an embodiment of the present disclosure may further include a side sealing member 107.

The side sealing member 107 may be provided to cover the outer surface of the substrate 100 and a side surface of the transparent buffer layer 170. The side sealing member 107 according to an embodiment may be formed of a silicon-based or UV curing-based sealant (or resin), but considering a process tack time, the side sealing member 107 may be formed of a UV curing-based sealant. Also, the side sealing member 107 may have a color (for example, blue, red, green, or black), or may be formed of a colored resin or a light blocking resin for preventing side light leakage without being limited thereto. The side sealing member 107 prevents side light leakage while light emitted from the micro light emitting device 150 of each subpixel SP travels in a direction from the inside of the transparent buffer layer 170 to an outermost surface, and buffers an external impact to prevent a side surface of each of the substrate 100 and the transparent buffer layer 170 from being damaged by the external impact.

Figure 8:
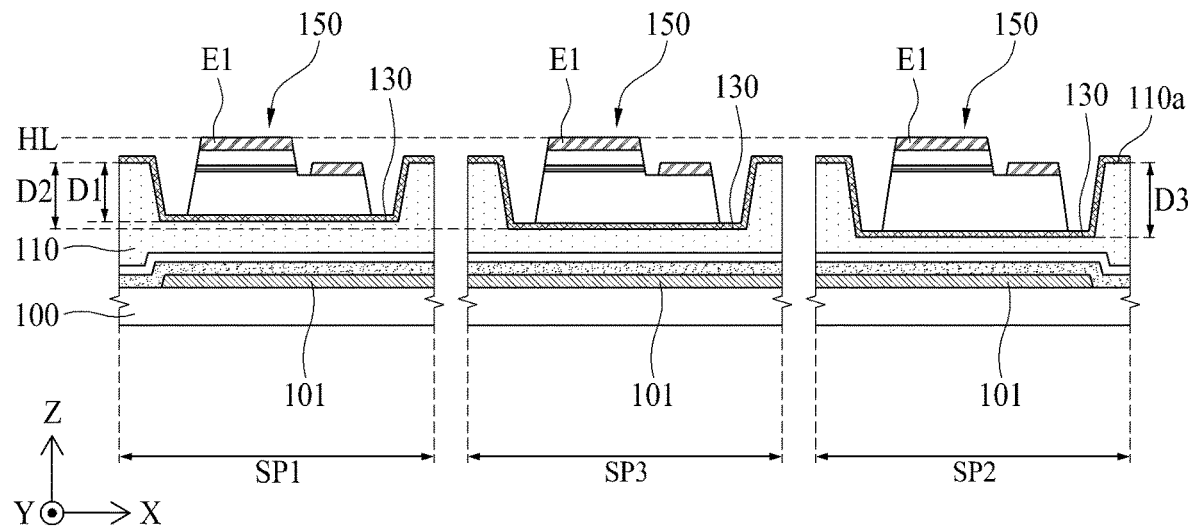
FIG. 8 is a diagram for describing an alternate embodiment of a concave portion according to an embodiment of the present disclosure.

FIG. 8 is a diagram for describing an alternate embodiment of a concave portion according to an embodiment of the present disclosure.

Referring to FIG. 8, a plurality of concave portions 130 respectively provided in a plurality of subpixels SP1, SP2 and SP3 of each of a plurality unit pixels UP1 and UP2 according to the modification embodiment may have the same shapes and may be formed concavely from a passivation layer 110 to have different depths D1, D2 and D3 in respective subpixels SP, respectively.

The concave portions 130 according to an embodiment may be provided to have the different depths D1 to D3 from the passivation layer 110, based on a height of a micro light emitting device 150 which is to be provided in a corresponding subpixel, thereby removing or minimizing a height deviation (or a step height) between micro light emitting devices by colors.

In order to realize a color image, the light emitting diode display device according to the present embodiment may include a red subpixel SP1, a green subpixel SP2, and a blue subpixel SP3, and the micro light emitting device 150 may be provided by colors and may be disposed in the concave portion 130 provided in a subpixel having a corresponding color. In this case, the color-based micro light emitting devices 150 may have different heights (or thicknesses) due to a process error of a manufacturing process. For example, thicknesses of the color-based micro light emitting devices 150 may be thickened in the order of red, green, and blue. In this case, the depths D1 to D3 of the concave portions 130 may be deeply provided in the order of the red subpixel SP1, the green subpixel SP2, and the blue subpixel SP3, based on a height of a corresponding micro light emitting device 150.

Therefore, in the present embodiment, the depths of the concave portions 130 provided in respective subpixels may be differently set based on a height (or a thickness) of the micro light emitting device 150 which is to be provided in a corresponding subpixel, and thus, uppermost surfaces (for example, tops of first electrodes E1) of the color-based micro light emitting devices 150 disposed in respective subpixels may be disposed on the same horizontal line HL, thereby preventing an open defect, where first electrodes (or second electrodes) of the color-based micro light emitting devices 150 are not exposed, from occurring due to a thickness deviation between the color-based micro light emitting devices 150 in a patterning process for first and second electrode contact holes. Also, in the present embodiment, in the top emission structure, an optical distance between a reflective layer 101 and the color-based micro light emitting devices of each subpixel is optimized by using the concave portions 130 which are provided to the different depths D1 to D3 in respective subpixels, and thus, a reflection efficiency of the reflective layer 101 is improved, thereby maximizing a light efficiency of each of the micro light emitting devices.

Figure 9:
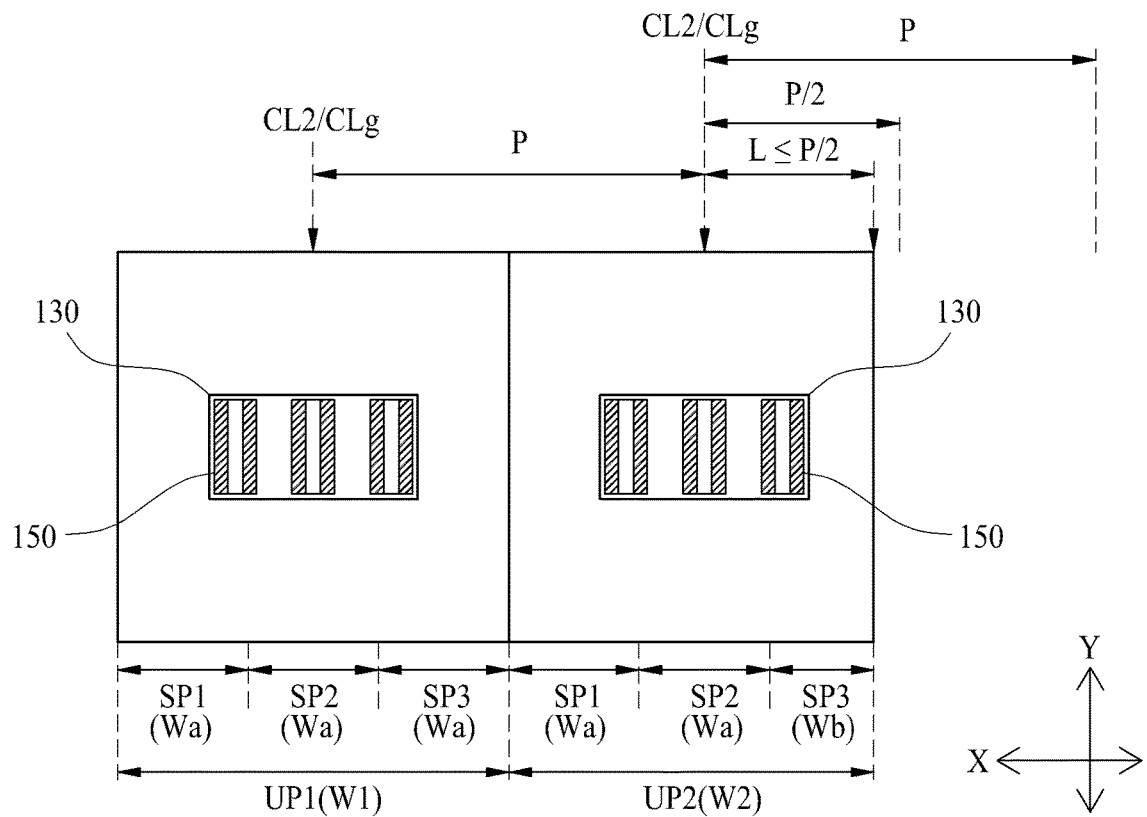
FIG. 9 is a plan view for describing an alternate embodiment of a concave portion according to an embodiment of the present disclosure.

FIG. 9 is a plan view for describing an alternate embodiment of a concave portion according to an embodiment of the present disclosure.

Referring to FIG. 9, in the present embodiment, a plurality of concave portions 130 respectively provided in a plurality of subpixels SP1 to SP3 of each of a plurality of unit pixels UP1 and UP2 may communicate with each other without a boundary portion and may include one accommodating space. That is, each of a plurality of first unit pixels UP1 and each of a plurality of second unit pixels UP2 may include only one concave portion 130 provided all over first to third subpixels SP1 to SP3.

The concave portion 130 may have a tetragonal shape which extends toward the first subpixel SP1 and the third subpixel SP3 with respect to a center portion of each of the unit pixels UP1 and UP2 or a center line CL2 of the second subpixel SP2. That is, a center line CLg of the concave portion 130 may match the center line CL2 of the second subpixels SP2 with respect to the first horizontal axis direction X.

As described above, in the present embodiment, since the one concave portion 130 is provided in the unit pixels UP1 and UP2, deviation of the micro light emitting device 150 is prevented in a mounting process for a micro light emitting device 150 corresponding to each of the subpixels SP1 to SP3, and an alignment precision of the micro light emitting device 150 is enhanced.

Figure 10:
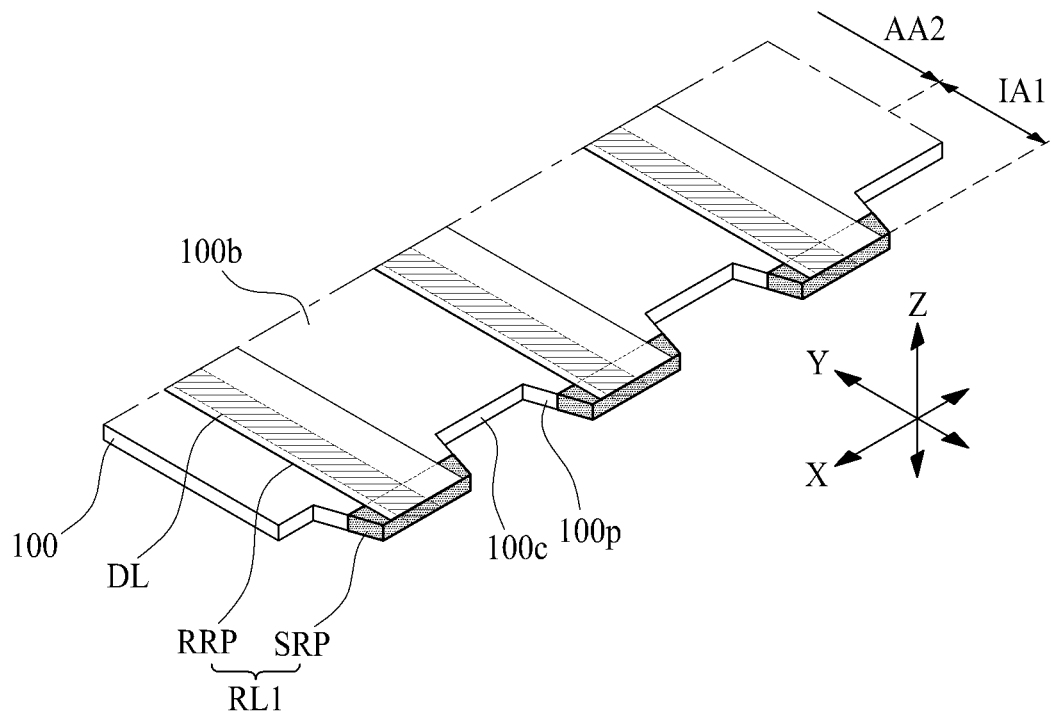
FIG. 10 is a diagram for describing a routing line of a light emitting diode display device illustrated in FIGS. 2 and 7.

FIG. 10 is a diagram for describing a routing line of the light emitting diode display device illustrated in FIGS. 2 and 7.

Referring to FIG. 10, in the light emitting diode display device according to the present embodiment, a substrate 100 may include a plurality of grooves 100c provided in a first non-display area IA1.

The first non-display area IA1 of the substrate 100 may be defined as a lower non-display area of the substrate 100 overlapping an edge of each of a plurality of data lines DL.

The plurality of grooves 100c may be arranged at certain intervals along a first horizontal axis direction X and may be provided concavely in a direction from an outer surface of the substrate 100 to a second display area AA2. The plurality of grooves 100c according to an embodiment may be formed through a substrate cutting process. The substrate cutting process according to an embodiment may cut a portion of an edge of the substrate 100 corresponding to a space between the plurality of data lines DL by using a laser scribing process to form the plurality of grooves 100c. Therefore, the outer surface of the substrate 100 may include the concavely provided plurality of grooves 100c and a plurality of protrusions 100p which are provided between the plurality of grooves 100c and respectively overlap ends of the plurality of data lines DL.

In the light emitting diode display device according to the present embodiment, a plurality of first routing lines RL1 may be respectively connected to the plurality of data lines DL, provided on a front surface 100a of the substrate 100, through the respective protrusions 100p provided on the substrate 100 in a one-to-one relationship.

The plurality of second routing lines RL2 according to an embodiment may each include a side routing pattern SRP and a rear routing pattern RRP.

The side routing pattern SRP may be provided to surround half or less of each of the plurality of protrusions 100p. That is, the side routing pattern SRP may be formed to fully surround approximate half of each of the plurality of protrusions 100p and may be provided through a dipping process using a conductive solution or a silver paste.

The rear routing pattern RRP may be provided in an edge of a rear surface 100b of the substrate 100 and may be electrically connected to the side routing pattern SRP. Also, the rear routing pattern RRP may be electrically connected to a first pad of a first pad part provided on the rear surface 100b of the substrate 100. The rear routing pattern RRP may be provided through a printing process using a conductive paste, for example, a silver paste.

In addition, in the light emitting diode display device according to the present embodiment, the substrate 100 may further include a plurality of grooves, provided in a second non-display area overlapping ends of a plurality of gate lines, and a plurality of protrusions provided between the plurality of grooves. The plurality of second routing lines may be respectively provided in the plurality of protrusions in the same structure and method as the above-described plurality of first routing lines, and thus, their detailed descriptions are not repeated.

Figure 11A:
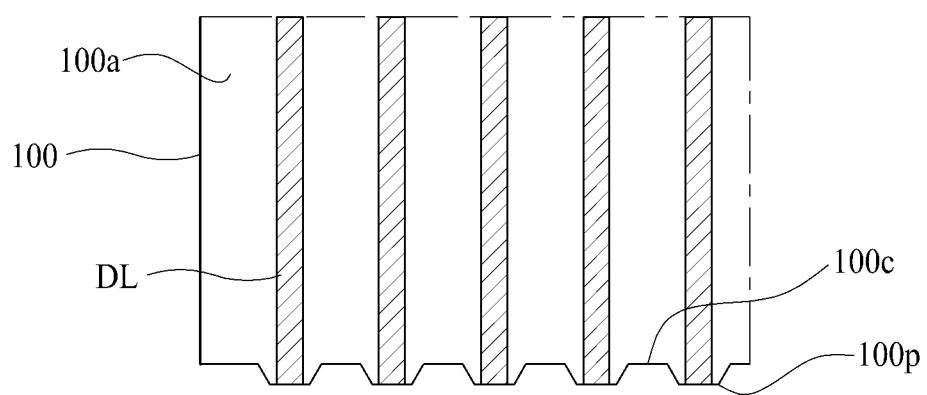
FIGS. 11A to 11C are diagrams for describing a method of manufacturing a plurality of first routing lines illustrated in FIG. 10.
Figure 11B:
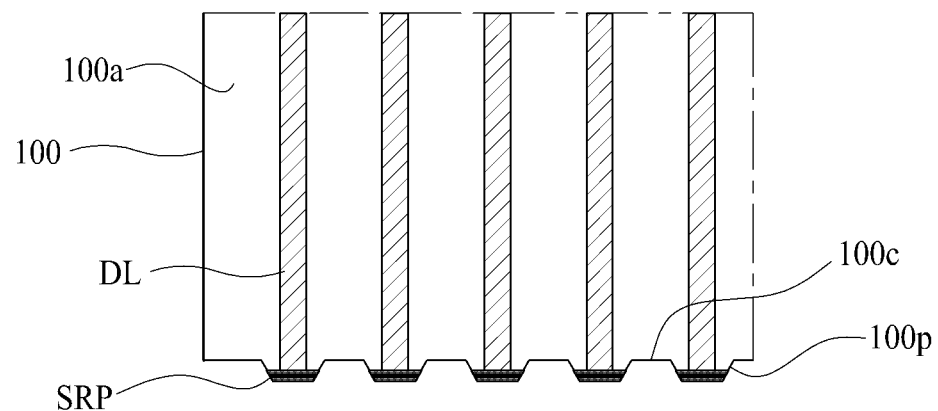
Figure 11C:
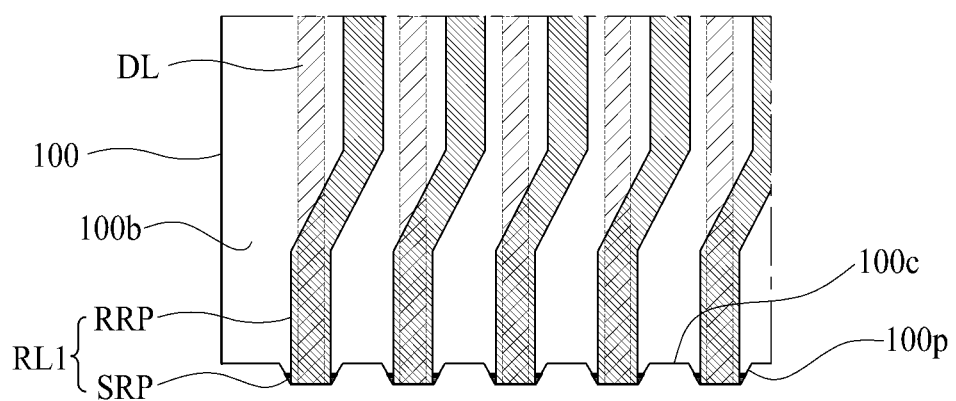

FIGS. 11A to 11C are diagrams for describing a method of manufacturing the plurality of first routing lines illustrated in FIG. 10.

The method of manufacturing the plurality of first routing lines according to the present embodiment will be described with reference to FIGS. 11A to 11C.

First, a substrate 100 including a plurality of pixel driving lines including a plurality of data lines DL may be provided.

Subsequently, as illustrated in FIG. 11A, a plurality of grooves 100c may be formed through a substrate cutting process in order for ends of the plurality of data lines DL to protrude. The substrate cutting process according to an embodiment may cut a portion of an edge of the substrate 100 corresponding to a space between the plurality of data lines DL by using a laser scribing process to form a plurality of protrusions 100p overlapping the ends of the plurality of data lines DL.

Subsequently, as illustrated in FIG. 11B, a plurality of side routing patterns SRP which respectively surround the plurality of protrusions 100p provided on the substrate 100 in a one-to-one relationship may be formed. For example, the plurality of side routing patterns SRP may be formed by a dipping process of dipping approximate half of the protrusions 100p into a conductive solution and coating the conductive solution on a front surface, a side surface, and a rear surface of each of the plurality of protrusions 100p. By performing the dipping process, each of the plurality of side routing patterns SRP electrically and respectively connected to the plurality of data lines DL may be individually provided, and each of the plurality of side routing patterns SRP may be electrically separated from each other by the plurality of grooves 100c provided on the substrate 100. Here, the conductive solution may include a conductive paste, for example, a silver paste.

Subsequently, as illustrated in FIG. 11C, the plurality of rear routing patterns RRP which are respectively connected to the plurality of side routing patterns SPR in a one-to-one relationship may be formed on a rear surface 100b of the substrate 100, thereby providing a plurality of first routing lines RL1 including a side routing pattern SPR and a rear routing pattern RRP which are connected to the ends of the plurality of data lines DL and extend to the outer surface and the rear surface 100b of the substrate 100. Here, the plurality of rear routing patterns RRP according to an embodiment may be provided through a printing process using a conductive paste.

In addition, in the light emitting diode display device according to the present embodiment, the plurality of second routing lines are provided by a manufacturing method which is the same as a method of manufacturing the plurality of first routing lines, and thus, description on the manufacturing method is not repeated.

By using the routing line and the method of manufacturing the same according to the present embodiment, a process of forming a routing line on the outer surface of the substrate 100 is simplified, electrical short circuit between adjacent routing lines is prevented, and a chamfer process or a rounding process for the edge of the substrate 100 may be omitted.

Figure 12:
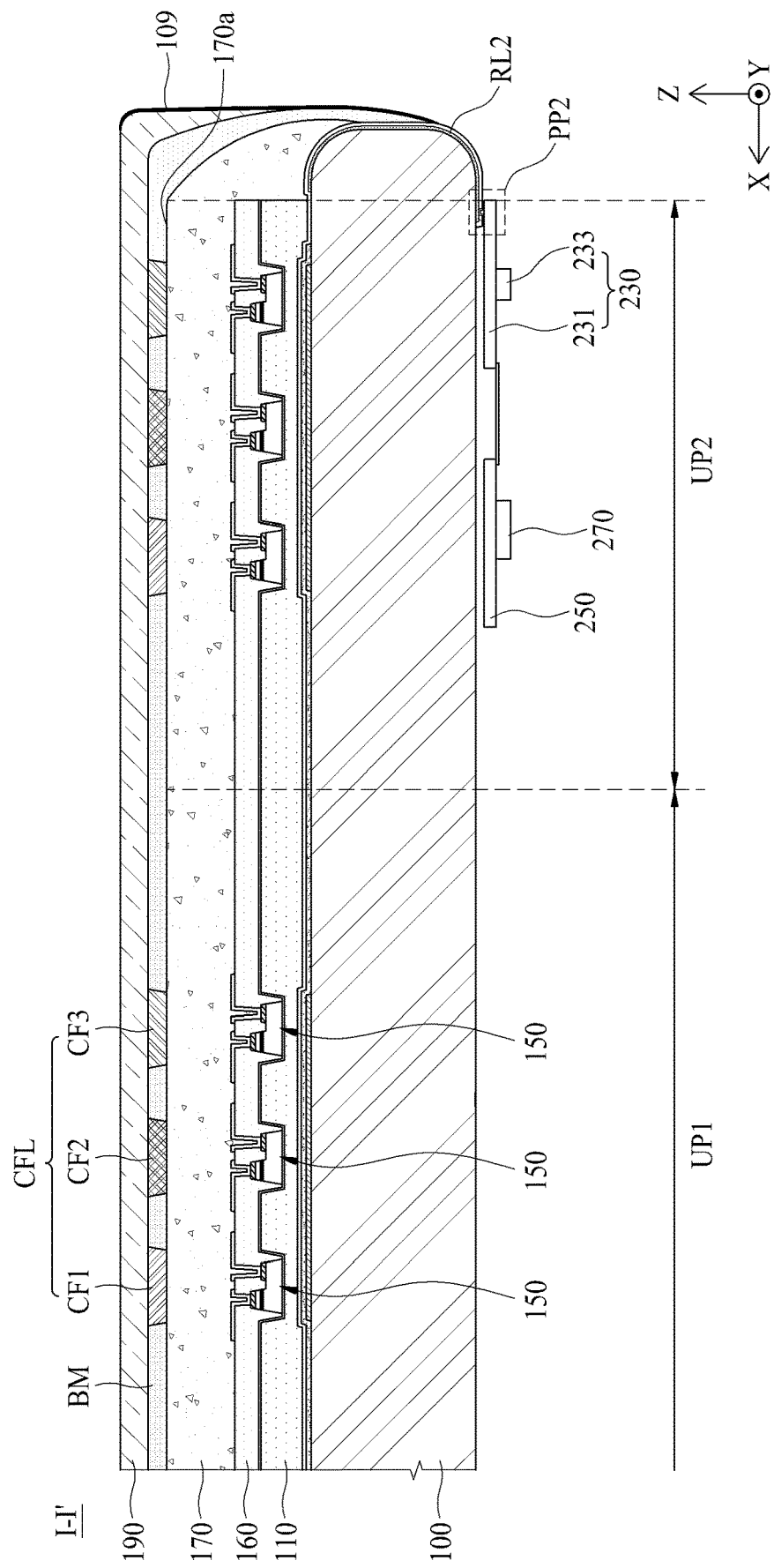
FIGS. 12 and 13 are cross-sectional views taken along line I-I' illustrated in FIG. 6.

FIG. 12 is a cross-sectional view taken along line I-I' illustrated in FIG. 6 and illustrates an example where a color filter is added to the light emitting diode display device according to an embodiment of the present disclosure. Hereinafter, therefore, only an element added to the light emitting diode display device according to an embodiment of the present disclosure will be described.

Referring to FIG. 12 along with FIG. 6, the light emitting diode display device according to the present embodiment may further include a black matrix BM and a color filter layer CFL.

First, a micro light emitting device 150 provided in each of a plurality of subpixels SP1 to SP3 may emit white light. That is, all the micro light emitting devices 150 provided on a substrate 100 may be white micro light emitting devices emitting white light.

The black matrix BM may define an opening area of each of the subpixels SP1 to SP 3 and may be directly provided on a top 170a of a transparent buffer layer 170 which overlaps the micro light emitting device 150 of each of the subpixels SP1 to SP3 in a one-to-one relationship, thereby preventing color mixture between adjacent subpixels SP1 to SP3. The black matrix BM may include a light absorbing material.

Optionally, the black matrix BM may be provided to cover side surface of the transparent buffer layer 170 and an outer surface of the substrate 100. In this case, the black matrix BM prevents side light leakage while light emitted from the micro light emitting device 150 of each of the subpixels SP1 to SP3 travels in a direction from the inside of the transparent buffer layer 170 to an outermost surface.

The color filter layer CFL may be directly formed on a top 170a of the transparent buffer layer 170 overlapping the opening area defined by the black matrix BM and may include a red color filter CF1, a green color filter CF2, and a blue color filter CF3 corresponding to respective colors defined in the plurality of subpixels SP1 to SP3. The color filter layer CFL may transmit only light, having a wavelength of a color corresponding to a corresponding subpixel SP, of the white light emitted from each of the subpixels SP1 to SP3.

In addition, the light emitting diode display device according to the present embodiment may further include a cover layer 190.

The cover layer 190 may be provided on the substrate 100 to cover the black matrix BM and the color filter layer CFL. The cover layer 190 according to an embodiment may be formed of a material having a relatively low refractive index. For example, the cover layer 190 may be formed of LiF, $MgF_2$, $CaF_2$, $ScF_3$, and/or the like and may have a multi-layer structure having different refractive indexes. The cover layer 190 may be provided on the substrate 100 to cover the black matrix BM and the color filter layer CFL, thereby protecting each of the subpixels SP1 to SP3 and efficiently outputting light, emitted from a micro light emitting device 150 of each of the subpixels SP1 to SP3, to the outside.

Optionally, the light emitting diode display device according to the present embodiment may further include a side coating layer 109.

The side coating layer 109 may be provided to cover an outer surface of the cover layer 109. The side coating layer 109 according to an embodiment may be provided to cover the outer surface of the cover layer 190 through a coating process using a black ink including a black-based light absorbing material. Furthermore, the side coating layer 109 may be additionally provided on the outer surface of the substrate 100 and a side surface of the black matrix BM. The side coating layer 109 prevents side light leakage while light emitted from the micro light emitting device 150 of each of the subpixels SP1 to SP3 travels in a direction from the inside of the cover layer 190 to an outermost surface.

The cover layer 190 may be replaced with a transparent substrate including a glass material or a transparent plastic material, and in this case, the transparent substrate may be adhered to the black matrix BM and the color filter layer CFL by using a transparent adhesive member. Furthermore, the black matrix BM and the color filter layer CFL may be provided on the transparent substrate without being directly formed on a top 170a of the transparent buffer layer 170, and in this case, the transparent substrate including the black matrix BM and the color filter layer CFL may be adhered to the top 170a of the transparent buffer layer 170 by using the transparent adhesive member.

As described above, in the present embodiment, since the micro light emitting devices 150 having the same color are respectively mounted on the subpixels SP1 to SP3, a mounting process for the micro light emitting devices 150 may be performed without differentiating micro light emitting devices by colors, thereby shortening a mounting process time taken in the mounting process for the micro light emitting devices.

Figure 13:
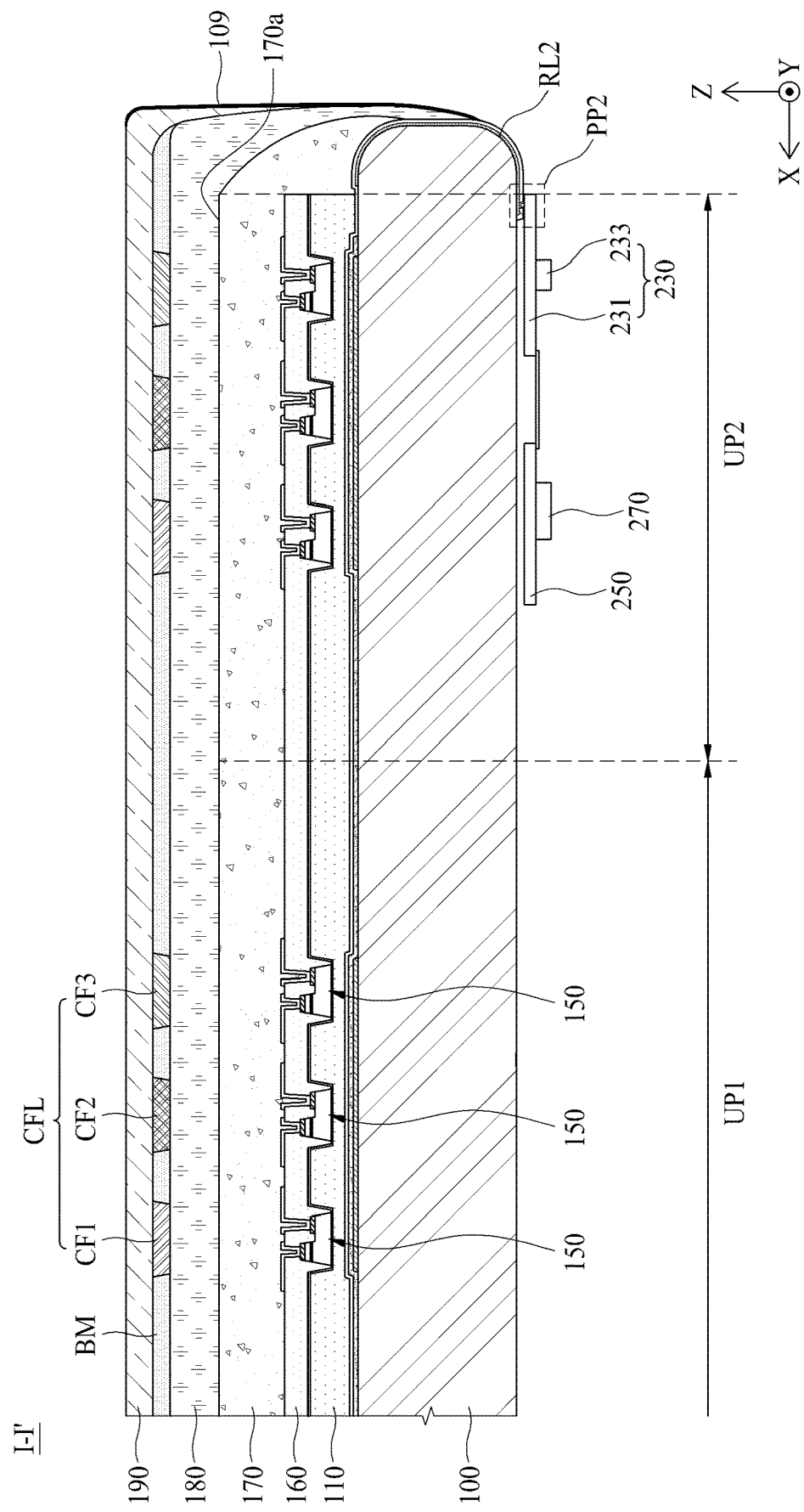

FIG. 13 is a cross-sectional view taken along line I-I' illustrated in FIG. 6 and illustrates an example where a wavelength conversion layer is added to the light emitting diode display device illustrated in FIG. 12. Hereinafter, therefore, the wavelength conversion layer and elements relevant thereto will be described.

Referring to FIG. 13, in the light emitting diode display device according to the present embodiment, if a micro light emitting device 150 emitting light of a first color except white is identically disposed in each of a plurality of subpixels SP1 to SP3, a wavelength conversion layer 180 may be provided on a top of a transparent buffer layer 170, for realizing colors through a plurality of unit pixels UP1 and UP2. That is, the wavelength conversion layer 180 may be provided between the color filter layer CFL and the transparent buffer layer 170.

The wavelength conversion layer 180 may emit light of a second color, based on the light of the first color incident from the micro light emitting device 150 of each of the subpixels SP1 to SP3. That is, the wavelength conversion layer 180 may absorb the light of the first color and may emit the light of the second color through re-emission. Here, the light of the first color may be blue light, and the light of the second color may be yellow light.

For example, the wavelength conversion layer 180 may be directly coated on a top 170a of the transparent buffer layer 170 in a liquid state, and then, may be cured by a curing process using heat and/or light. As another example, the wavelength conversion layer 180 may be manufactured in a sheet form and may be directly adhered to the top 170a of the transparent buffer layer 170.

The wavelength conversion layer 180 according to an embodiment may include a phosphor or a quantum dot.

The phosphor according to an embodiment may be a yellow phosphor which is excited by blue light to emit yellow light, and for example, may be an yttrium aluminum garnet (YAG)-based material.

The quantum dot according to an embodiment may be excited by blue light to emit yellow light and may have a size for emitting light having a yellow wavelength, and for example, may include CdS, CdSe, CdTe, ZnS, ZnSe, GaAs, GaP, GaAs—P, Ga—Sb, InAs, InP, InSb, AlAs, AlP, AlSb, and/or the like.

The light of the second color, which is re-emitted from the wavelength conversion layer 180 according to the present embodiment and is irradiated onto a cover layer 190, may be combined with the light of the first color irradiated onto the second substrate 500 without being re-emitted from the wavelength conversion layer 180, and thus, may be converted into white light. The white light may be filtered by a color filter overlapping each of the subpixels SP1 to SP3, and thus, may be emitted as color light corresponding to each of the subpixels SP1 to SP3.

Except that the black matrix BM and the color filter layer CFL are provided on the top 170a of the wavelength conversion layer 180, the black matrix BM and the color filter layer CFL are the same as FIG. 12, and thus, their detailed descriptions are not repeated.

As described above, in the present embodiment, since the micro light emitting devices 150 having the same color are respectively mounted on the subpixels SP1 to SP3, a mounting process for the micro light emitting devices 150 may be performed without differentiating micro light emitting devices by colors, thereby shortening a mounting process time taken in the mounting process for the micro light emitting devices.

The cover layer 190 may be replaced with a transparent substrate including a glass material or a transparent plastic material, and in this case, the transparent substrate may be adhered to the wavelength conversion layer 180 by using a transparent adhesive member. Furthermore, the wavelength conversion layer 180 may be provided on the transparent substrate without being directly be formed on a top 170a of the transparent buffer layer 170, and in this case, the transparent substrate may be adhered to the top 170a of the transparent buffer layer 170 by using the transparent adhesive member.

Figure 14:
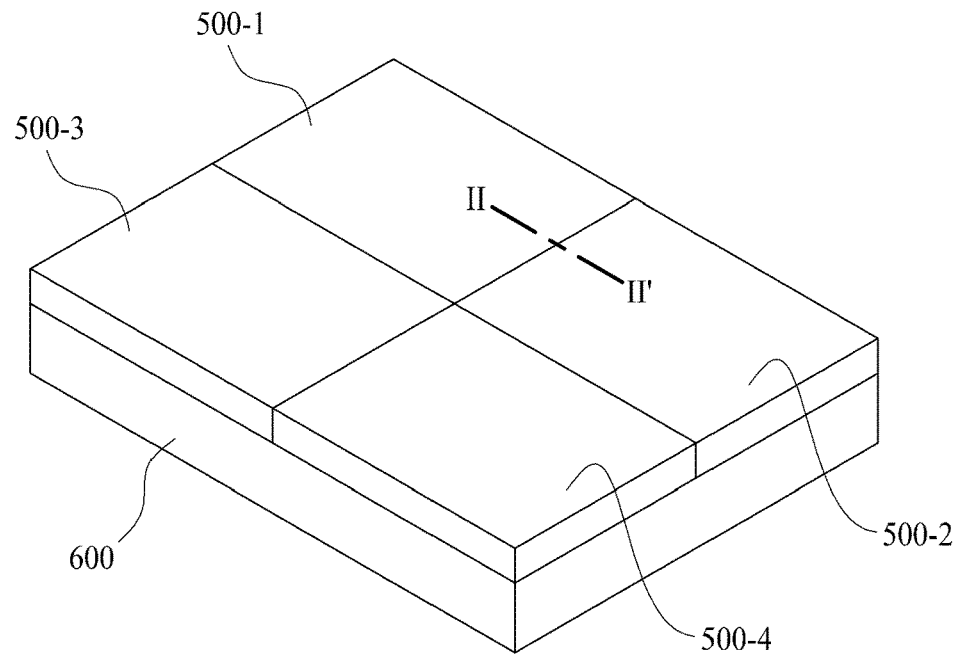
FIG. 14 is a diagram for describing a multi-screen display device according to an embodiment of the present disclosure.
Figure 15:
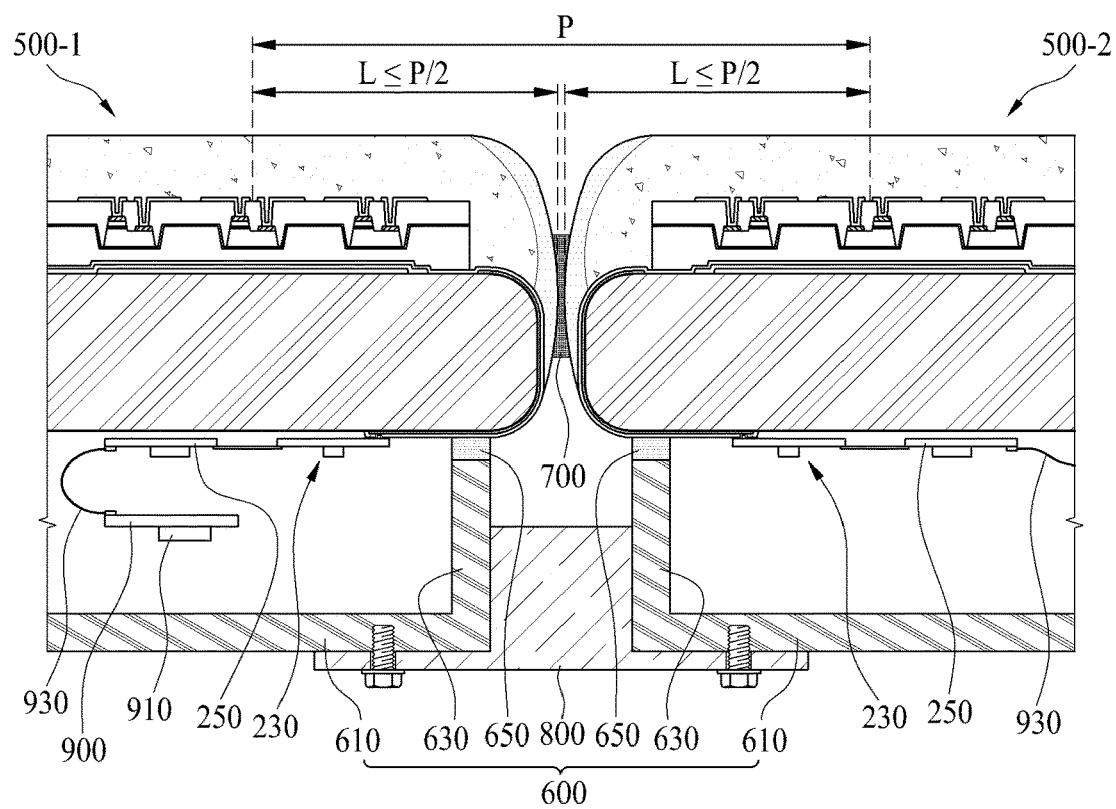
FIG. 15 is a cross-sectional view taken along line II-II' illustrated in FIG. 14.

FIG. 14 is a diagram for describing a multi-screen display device according to an embodiment of the present disclosure, and FIG. 15 is a cross-sectional view taken along line II-II' illustrated in FIG. 14.

Referring to FIGS. 14 and 15 along with FIG. 7, the multi-screen display device according to the present embodiment may include a plurality of screen modules 500-1, 500-2, 500-3 and 500-4 and a housing 600.

The plurality of screen modules 500-1 to 500-4 may be arranged in an NxM form (where N is a positive integer equal to or more than two, and M is a positive integer equal to or more than two) to respectively display individual images or divisionally display one image. The plurality of screen modules 500-1 to 500-4 may each include the light emitting diode display device according to the embodiments of the present disclosure illustrated in FIGS. 1 to 13, and a repetitive description on the light emitting diode display device is not provided.

Side surfaces of the plurality of screen modules 500-1 to 500-4 according to an embodiment may be coupled to each other by a module coupling member 700 provided on the outer surface of the substrate 100. The module coupling member 700 may couple the side surfaces of two adjacent screen modules of the plurality of screen modules 500-1 to 500-4 arranged in a lattice form, thereby implementing the multi-screen display device. The module coupling member 700 according to an embodiment may be formed of an adhesive or a double-sided tape which enables a relatively thin thickness, for minimizing a space between two adjacent screen modules of the plurality of screen modules 500-1 to 500-4.

In each of the plurality of screen modules 500-1 to 500-4, a maximum distance L between the second unit pixel UP2 and the outer surface of the substrate 100 may be half "P/2" or less of the reference pixel pitch P at which the plurality of first unit pixels UP1 are arranged. Therefore, a maximum distance between second unit pixels UP2 of two adjacent screen modules of which side surfaces are coupled to each other with the module coupling member 700 between the two adjacent screen modules may be equal to or less than the reference pixel pitch P. In other words, a pixel pitch between the second unit pixels UP2 of two adjacent screen modules may be equal to or less than the reference pixel pitch P at which the first unit pixels UP1 respectively provided in the plurality of screen modules 500-1 to 500-4 are arranged. Therefore, in the present embodiment, an area where a dark portion caused by a boundary portion between two adjacent screen modules of the screen modules 500-1 to 500-4 occurs is reduced or removed, and thus, an image where a sense of discontinuity of a whole screen is reduced or minimized may be displayed.

The housing 600 may support a rear edge of each of the plurality of screen modules 500-1 to 500-4 and may cover a rear surface of the plurality of screen modules 500-1 to 500-4. The housing 600 according to an embodiment may include a housing plate 610, covering the rear surface of each of the plurality of screen modules 500-1 to 500-4, and a housing side wall 630 which is provided vertical to the housing plate 610 and supports the rear edge of each of the plurality of screen modules 500-1 to 500-4.

The housing plate 610 according to an embodiment may be configured as one body covering the whole rear surface of each of the plurality of screen modules 500-1 to 500-4.

The housing plate 610 according to an embodiment may be configured with a plurality of division plates to overlap the rear surface of each of the plurality of screen modules 500-1 to 500-4.

The housing side wall 630 may be installed vertical to a top of the housing plate 610 overlapping the rear edge of each of the plurality of screen modules 500-1 to 500-4 and may individually support the rear edge of each of the plurality of screen modules 500-1 to 500-4. In this case, the housing side wall 630 may support the rear edge of each of the plurality of screen modules 500-1 to 500-4 through a module supporting member 650. Here, the module supporting member 650 may be an elastic member, a foam pad, a double-sided tape, or the like.

In addition, the housing 600 may include a plurality of module housings including the housing plate 610 and the housing side wall 630. Each of the plurality of housing modules may individually support the rear edges of the plurality of screen modules 500-1 to 500-4 and may cover the rear surfaces of the plurality of screen modules 500-1 to 500-4. In this case, the housing 600 may include a housing coupling member 800 provided between the plurality of module housings. The housing coupling member 800 may be inserted into a space between adjacent module housings and may be fixed to the housing plate 610 of each of adjacent module housings by a fastening member such as a bolt, a screw, and/or the like.

In addition, the multi-screen display device according to the present embodiment may further include an integration control board 900 and an image signal generator 910 mounted on the integration control board 900.

The integration control board 900 may be disposed in an accommodating space provided on the rear surface of each of the plurality of screen modules 500-1 to 500-4 by the housing 600. The integration control board 900 may be connected to the control board 250 of each of the plurality of screen modules 500-1 to 500-4 through at least one signal cable 930.

The image signal generator 910 may be mounted on the integration control board 900. The image signal generator 910 may receive a raw image signal supplied from an external host driving system and may generate a module-based input image signal corresponding to each of images which are to be respectively displayed by display devices of the plurality of screen modules 500-1 to 500-4, based on the received raw image signal. That is, the image signal generator 910 may receive all resolution information, including a first display area AA1 and a second display area AA2, about each of the plurality of screen modules 500-1 to 500-4, divide the raw image signal according to the resolution information about each module to generate the module-based input image signal, and supply the module-based input image signal to a corresponding screen module of the plurality of screen modules 500-1 to 500-4. Therefore, each of the plurality of screen modules 500-1 to 500-4 may display a module-based image corresponding to module-based panel image data, based on the input image signal supplied from the image signal generator 910.

As described above, since the multi-screen display device according to the present embodiment includes the screen modules 500-1 to 500-4 configured with the light emitting diode display device according to the embodiments of the present disclosure, an area where a dark portion caused by a boundary portion between two adjacent screen modules of the screen modules 500-1 to 500-4 occurs is reduced or removed, and thus, an image where a sense of discontinuity of a whole screen is reduced or minimized may be displayed.

Figure 16A:
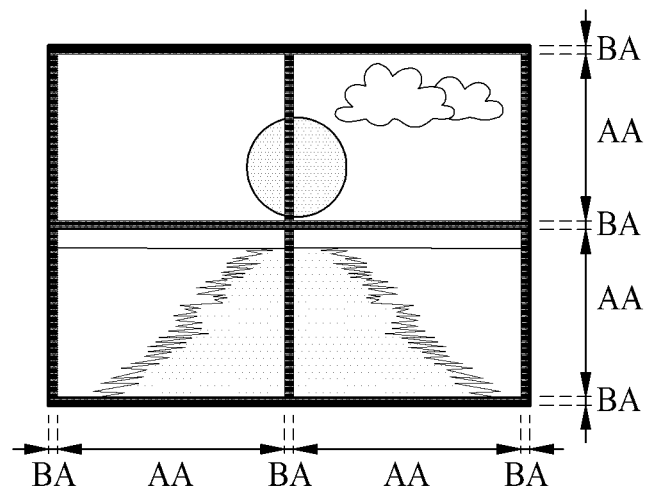
FIG. 16A is a multi-screen display device of the related art.

FIG. 16A is a multi-screen display device of the related art

Figure 16B:
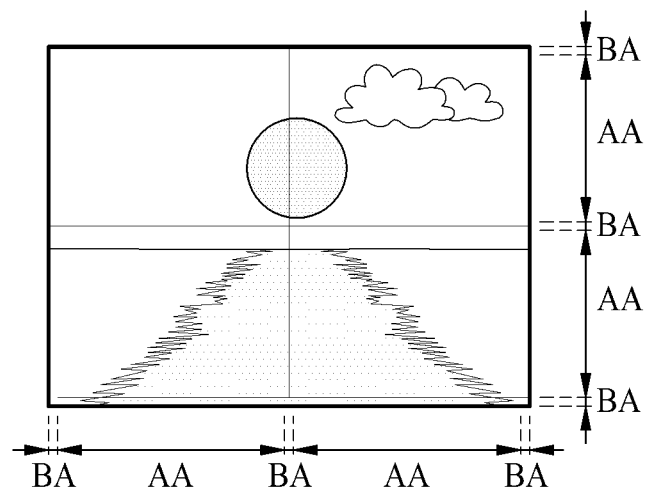
FIG. 16B is a multi-screen display device according to an embodiment of the present disclosure.

FIG. 16B is a multi-screen display device according to an embodiment of the present disclosure.

First, referring to FIG. 16A, in the related art multi-screen display device, since an image is displayed on only a display area AA of each of a plurality of display devices, it can be seen that due to a bezel area BA based on a front case of each of the plurality of display devices, a dark portion occurs in a boundary portion between display devices coupled to each other, and a disconnected image caused by the dark portion of the boundary portion is displayed in a whole screen.

On the other hand, referring to FIG. 16B, in the multi-screen display device according to the embodiments of the present disclosure, since a pixel pitch between second unit pixels of two adjacent screen modules of which side surfaces are coupled to each other is equal to or less than a reference pixel pitch of a first unit pixel, it can be seen that an area where a dark portion caused by a boundary portion between a plurality of screen modules occurs is reduced or removed, and thus, an image where a sense of discontinuity of a whole screen is reduced or minimized is displayed.

As a result, even in a case where side surfaces of a plurality of screen modules are coupled to each other in a lattice form, the multi-screen display device according to the embodiments of the present disclosure may display one image where a sense of discontinuity of a whole screen is reduced or minimized, thereby enhancing a degree of viewing immersion of a user for an image displayed on a large-size screen.

As described above, according to the embodiments of the present disclosure, a light emitting diode display device having a bezel width suitable for minimizing a boundary portion between display devices coupled to each other in a multi-screen display device is provided, and alignment precision and productivity are enhanced in a mounting (or transfer) process for a micro light emitting device.

Moreover, according to the embodiments of the present disclosure, one image where a sense of discontinuity of a whole screen is reduced or minimized is displayed even in a case where side surfaces of a plurality of screen modules are coupled to each other in a lattice form, thereby enhancing a degree of viewing immersion of a user for an image displayed on a large-size screen.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting diode display device comprising:
a substrate including a first display area and a second display area outside of the first display area;
a plurality of first unit pixels in the first display area, the plurality of first unit pixels each including a plurality of subpixels each including a micro light emitting device;
a plurality of second unit pixels in the second display area adjacent an edge of the substrate; and
a planarization layer on the substrate,
wherein a distance between a center portion of the second unit pixel and an outer surface of the substrate is equal to or less than half of a reference pixel pitch at which the plurality of first unit pixels are arranged, wherein the reference pixel pitch being a distance between center portions of two adjacent first unit pixels,
wherein the micro light emitting device includes a first portion and a second portion opposite to the first portion, the first portion including a first electrode and a second electrode,
wherein the first electrode and the second electrode are positioned on the first portion, and
wherein each of the plurality of subpixels comprises:
a thin film transistor (TFT) on the substrate and surrounded by the planarization layer;
a pixel electrode on the planarization layer, electrically connected to the first electrode of the micro light emitting device and the TFT; and
a common electrode on the planarization layer and electrically connected to the second electrode of the micro light emitting device,
wherein the planarization layer surrounds the micro light emitting device, except for areas associated with the first and second electrodes.

2. The light emitting diode display device of claim 1, wherein each of the plurality of unit pixels comprises a first area and a second area surrounding the first area, wherein the micro light emitting device are configured in the first area.

3. The light emitting diode display device of claim 2, wherein a distance between a center portion of the first area and a corner portion of the unit pixels in the first display area is equal or greater than a distance between a center portion of the first area and a corner portion of the unit pixels in the second display area.

4. The light emitting diode display device of claim 1, wherein a distance between the first portion to the substrate is greater than a distance between the second portion to the substrate.

5. The light emitting diode display device of claim 1, wherein the micro light emitting device is a micro light emitting diode chip.

6. The light emitting diode display device of claim 1, further comprising at least one pixel driving line configured in the second area of each of the plurality of unit pixels.

7. The light emitting diode display device of claim 1, wherein
the substrate includes a top surface, a bottom surface and the outer surface extending at the outer periphery between the top surface and the bottom surface
the plurality of first unit pixels are arranged at the reference pixel pitch, and
a distance between a center portion of each of the plurality of second unit pixels and the outer surface of the substrate is half or less of the reference pixel pitch.

8. The light emitting diode display device of claim 7, wherein adjacent first and second unit pixels are arranged at the reference pixel pitch.

9. The light emitting diode display device of claim 1, wherein
the plurality of first unit pixels each comprise a first subpixel, a second subpixel and a third subpixel,
the plurality of second unit pixels each comprise a first subpixel, a second subpixel and a third subpixel, and the third subpixel of each of the plurality of second unit pixels is adjacent to the outer surface of the substrate and has a size less than a size of an adjacent second subpixel.

10. The light emitting diode display device of claim 1, wherein the plurality of second unit pixels each comprise a concave portion accommodating the micro light emitting device, and
wherein the plurality of first unit pixels are arranged at the reference pixel pitch, and in each of the plurality of second unit pixels, a distance between a center portion of the concave portion of each of the plurality of second unit pixels and the outer surface of the substrate is half or less of the reference pixel pitch.

11. The light emitting diode display device of claim 10, wherein the plurality of second unit pixels each comprise a first subpixel, a second subpixel and a third subpixels, and
wherein the concave portion is respectively provided in the first to third subpixels have different depths.

12. The light emitting diode display device of claim 11, wherein the concave portions respectively provided in the first to third subpixels comprise a single cavity.

13. The light emitting diode display device of claim 1, further comprising a display driving circuit which comprises:
a plurality of pixel driving lines on the substrate, the plurality of pixel driving lines including a plurality of gate lines and a plurality of data lines defining a plurality of subpixel areas;
a plurality of routing lines on the outer surface of the substrate and a rear surface of the substrate, the plurality of routing lines being connected to the plurality of pixel driving lines;
a pad part including a pad provided on each of the plurality of routing lines; and
a driving circuit connected to the pad part.

14. The light emitting diode display device of claim 13, wherein
the substrate comprises a plurality of grooves, provided concavely from the outer surface of the substrate, and a plurality of protrusions between the plurality of grooves, the plurality of protrusions overlapping ends of the plurality of pixel driving lines, and
the plurality of routing lines each comprise:
a side routing pattern electrically connected to the end of each of the plurality of pixel driving lines, the side routing pattern on a portion of each of the plurality of protrusions; and
a rear routing pattern provided on the rear surface of the substrate and electrically connected to the side routing pattern and the pad part.

15. The light emitting diode display device of claim 13, wherein the display driving circuit is disposed on the rear surface of the substrate.

16. A multi-screen display device comprising:
a plurality of screen modules; and
a plurality of module coupling members coupling side surfaces of the plurality of screen modules,
wherein the plurality of screen modules each comprise the light emitting diode display device of claim 1.

17. The multi-screen display device of claim 16, wherein each of the plurality of unit pixels comprises a first area and a second area surrounding the first area, and
wherein the micro light emitting device are configured in the first area.

18. The multi-screen display device of claim 17, further comprising at least one pixel driving line configured in the second area of each of the plurality of unit pixels.

19. The multi-screen display device of claim 16, further comprising a first electrode and a second electrode,
wherein the micro light emitting device comprises a first portion and a second portion opposite to the first portion, and
wherein the first electrode and the second electrode are positioned on the first portion.

20. The multi-screen display device of claim 16, wherein a maximum distance between center portions of second unit pixels of two screen modules which are adjacent to each other with one of the plurality of module coupling members between each other is equal to or less than the reference pixel pitch of a first unit pixel, the reference pixel pitch being a distance between center portions of two adjacent first unit pixels.

21. A light emitting diode display device comprising:
a substrate including a first display area and a second display area outside of the first display area;
a plurality of first unit pixels in the first display area, the plurality of first unit pixels each including a plurality of subpixels each including a micro light emitting device; and
a plurality of second unit pixels in the second display area adjacent an edge of the substrate,
wherein a distance between a center portion of the second unit pixel and an outer surface of the substrate is equal to or less than half of a reference pixel pitch at which the plurality of first unit pixels are arranged, wherein the reference pixel pitch being a distance between center portions of two adjacent first unit pixels,
wherein the micro light emitting device includes a first portion and a second portion opposite to the first portion, the first portion including a first electrode and a second electrode, and
wherein the first electrode and the second electrode are positioned on the first portion,
the plurality of first unit pixels each comprise a first subpixel, a second subpixel and a third subpixel,
the plurality of second unit pixels each comprise a first subpixel, a second subpixel and a third subpixels, and
the first to third subpixel of each of the plurality of first and second unit pixels each comprise:
a pixel circuit including a driving thin film transistor TFT;
a passivation layer covering the pixel circuit;
a pixel electrode electrically connecting the driving TFT to the first electrode of the micro light emitting device; and
a common electrode connected to the second electrode of the micro light emitting device.

22. The light emitting diode display device of claim 21, further comprising:
a planarization layer covering the micro light emitting device and the passivation layer; and
a transparent buffer layer covering the planarization layer,
wherein each of the pixel electrode and the common electrode is provided between the planarization layer and the transparent buffer layer.

23. The light emitting diode display device of claim 22, further comprising a side sealing member covering the outer surface of the substrate and an outer surface of the transparent buffer layer.

24. The light emitting diode display device of claim 22, further comprising a wavelength conversion layer on the transparent buffer layer, wherein the wavelength conversion layer comprises a phosphor or a quantum dot.

\* \* \* \* \*